United States Patent
Rice et al.

(10) Patent No.: US 8,934,748 B2
(45) Date of Patent: Jan. 13, 2015

(54) OPTICAL FIBER SYSTEMS AND METHODS

(75) Inventors: Robert R. Rice, Simi Valley, CA (US);
John Ballato, Clemson, SC (US);
Hacop Injeyan, Glendale, CA (US);
Hiroshi Komine, Torrance, CA (US);
Michael G. Wickham, Rancho Palos Verdes, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 829 days.

(21) Appl. No.: 12/989,326

(22) PCT Filed: Feb. 27, 2009

(86) PCT No.: PCT/US2009/035500
§ 371 (c)(1),
(2), (4) Date: Jan. 7, 2011

(87) PCT Pub. No.: WO2009/108873
PCT Pub. Date: Sep. 3, 2009

(65) Prior Publication Data
US 2011/0103756 A1 May 5, 2011

Related U.S. Application Data

(60) Provisional application No. 61/032,659, filed on Feb. 29, 2008.

(51) Int. Cl.
*G02B 6/02* (2006.01)
*C03B 37/026* (2006.01)
(Continued)

(52) U.S. Cl.
CPC ........... *C03B 37/026* (2013.01); *C03B 37/0235* (2013.01); *C03B 2203/12* (2013.01); *G02B 6/02* (2013.01); *G02B 6/024* (2013.01)
USPC .......................................... 385/123; 385/142

(58) Field of Classification Search
USPC .................................................. 385/123–128
See application file for complete search history.

(56) References Cited

U.S. PATENT DOCUMENTS

| 5,796,904 | A | * | 8/1998 | Marinelli et al. ............. 385/123 |
| 5,811,376 | A | * | 9/1998 | Huang .......................... 505/430 |
| 6,373,863 | B1 | | 4/2002 | Ohishi et al. |

(Continued)

FOREIGN PATENT DOCUMENTS

| GB | 2 020 057 A | | 11/1979 |
| JP | 04243999 A | * | 9/1992 |

OTHER PUBLICATIONS

J. Ballato, et al., "Silicon optical fiber", Optics Express, vo. 16 18675-83 (2008).*

(Continued)

*Primary Examiner* — Charlie Y Peng
(74) *Attorney, Agent, or Firm* — Tarolli, Sundheim, Covell & Tummino LLP

(57) ABSTRACT

One embodiment of the invention includes a method for forming an optical fiber. The method comprises providing a preform having a core material and a glass cladding material surrounding the core material. The method also comprises drawing the preform at a temperature that is greater than a melting temperature of the core material to form a drawn fiber. The method further comprises cooling the drawn fiber to form the optical fiber having a crystalline fiber core and a cladding that surrounds the crystalline fiber core and extends axially along a length of the crystalline fiber core.

25 Claims, 16 Drawing Sheets

(51) Int. Cl.
  *C03B 37/023* (2006.01)
  *G02B 6/024* (2006.01)

(56) References Cited

U.S. PATENT DOCUMENTS

| | | |
|---|---|---|
| 2002/0054741 A1 | 5/2002 | Brambilla et al. |
| 2002/0186921 A1 | 12/2002 | Schumacher et al. |
| 2005/0053345 A1* | 3/2005 | Bayindir et al. ............. 385/123 |
| 2005/0196092 A1 | 9/2005 | Enokihara et al. |
| 2005/0201715 A1 | 9/2005 | Ellwood |
| 2005/0265405 A1* | 12/2005 | Mannstadt et al. ............ 372/30 |
| 2005/0285121 A1 | 12/2005 | Kim |
| 2007/0074541 A1* | 4/2007 | Badding et al. ................. 65/413 |
| 2007/0086716 A1* | 4/2007 | Noda et al. ..................... 385/125 |
| 2008/0298741 A1* | 12/2008 | Zalevsky ........................ 385/12 |

OTHER PUBLICATIONS

International Search Report for corresponding PCT/US2009/035500, issued Aug. 31, 2010 by Dorthée Mülhausen of the International Bureau of WIPO.

Office Action for corresponding DE 11 2009 000 467.9 issued Oct. 20, 2011, received in US on Nov. 25, 2011.

\* cited by examiner

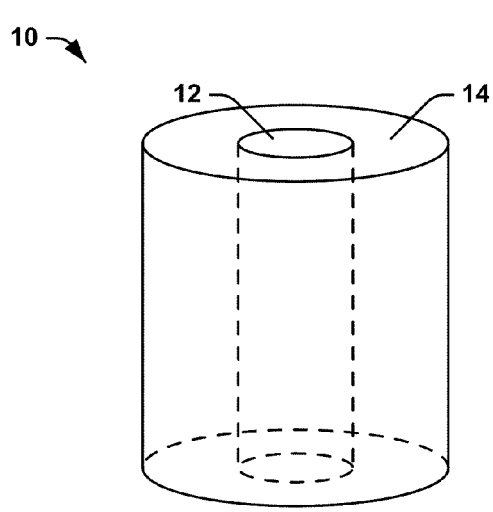
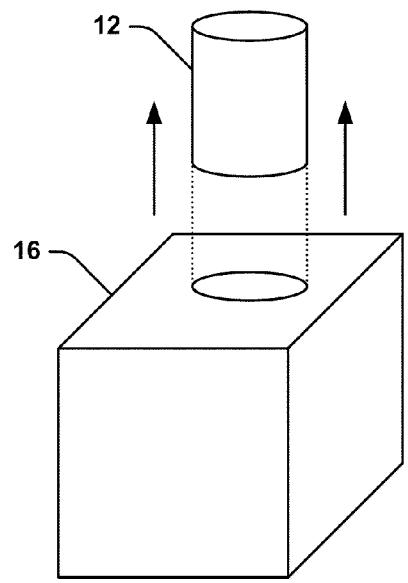
FIG. 1          FIG. 2
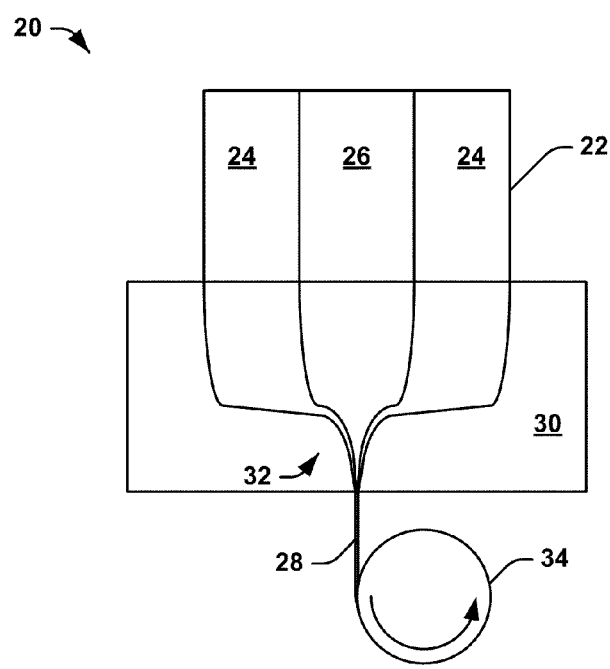
FIG. 3

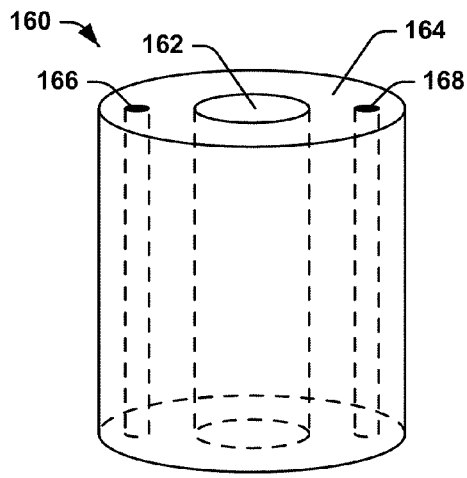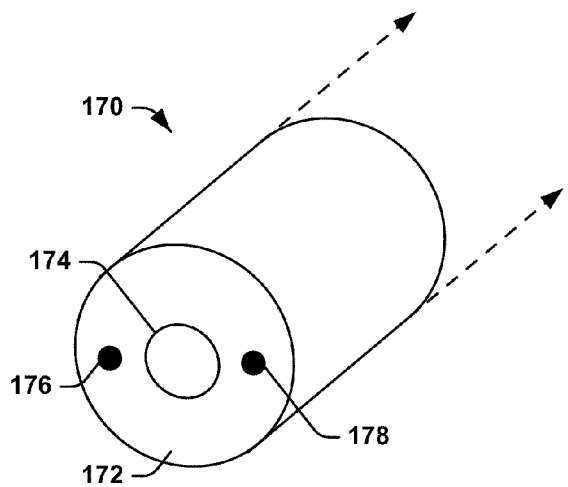
FIG. 10  FIG. 11
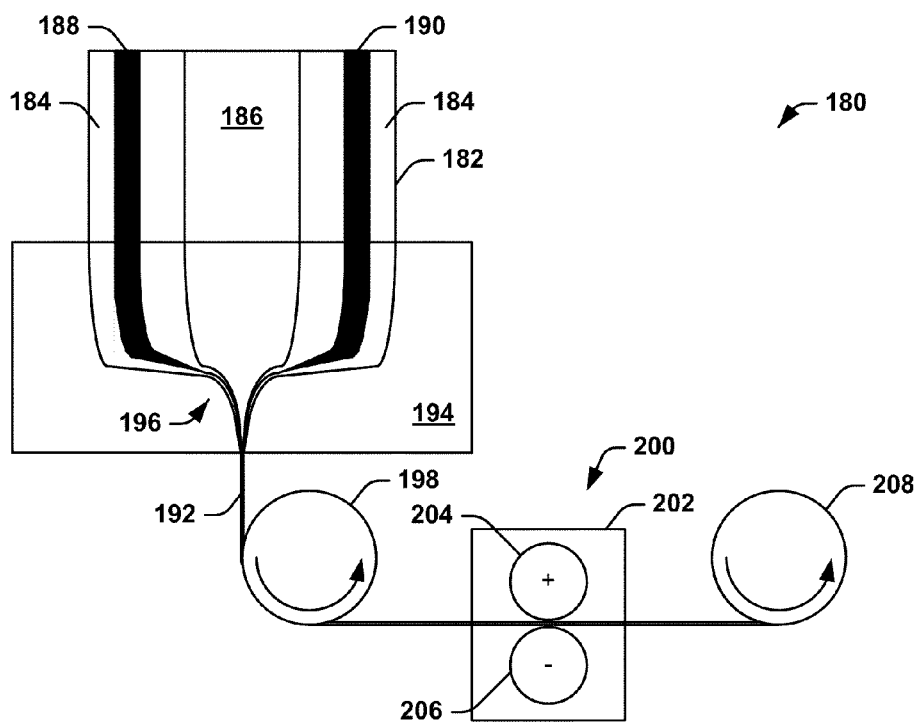
FIG. 12

OPTICAL FIBER SYSTEMS AND METHODS

CROSS REFERENCE TO RELATED APPLICATION

The present application claims filing benefit of U.S. Provisional Application No. 61/032,659 having a filing date of Feb. 29, 2008, which is incorporated herein by reference in its entirety.

TECHNICAL FIELD

The present invention relates generally to optics, and more particularly to optical fiber systems and methods.

BACKGROUND

Typical optical fibers include a core material and a cladding material, with each of the core and the cladding being fabricated from fused silica and having dissimilar refractive indices. A fiber can be formed by drawing a preform, which can be a large mass that includes the core and cladding materials arranged in a shape that can resemble across-section of the finished fiber. The preform can be drawn in a fiber drawing tower, such that the preform can be heated and stretched from one end to form the optical fiber. The finished fiber can have a length that can be constrained by a variety of factors, including physical and operational factors such as resulting from Raman gain and/or pump power.

The core material of a typical optical fiber can exhibit optical gain through a phenomenon called stimulated Raman scattering (SRS). Therefore, optical signals can be amplified as they propagate through an optical fiber. Amplification of optical signals via SRS is dependent on both a Raman gain coefficient of the core material and a length of the optical fiber. To achieve desired Raman gain coefficients, optical fiber cores are typically doped with additional materials to increase the optical gain of the fiber. However, such doping has limitations in contributing to a Raman gain coefficient. As a result, to achieve substantial amounts of optical amplification of a given optical signal, some optical fibers have to be fabricated at a length of hundreds of meters or more. Accordingly, some optical systems require a substantial amount of physical space and/or power to maximize optical signal intensity that is provided from an optical pump or laser.

SUMMARY

One embodiment of the invention includes a method for forming an optical fiber. The method comprises providing a preform having a core material and a glass cladding material surrounding the core material. The method also comprises drawing the preform at a temperature that is greater than a melting temperature of the core material to form a drawn fiber. The method further comprises cooling the drawn fiber to form the optical fiber having a crystalline fiber core and a cladding that surrounds the crystalline fiber core and extends axially along a length of the crystalline fiber core.

Another embodiment of the invention includes a method of forming an optical fiber. The method comprises drawing a preform comprising a cladding material and a core material from a first end at a temperature greater than a melting temperature of the core material to produce the optical fiber. The method can also include cooling the drawn fiber to spontaneously crystallize the core material of the drawn fiber. The method further comprises moving the drawn fiber beginning with the first end through a heat source that provides heat at an approximate crystallization temperature.

Another embodiment of the invention includes an optical fiber device. The optical fiber device comprises a crystalline core that extends axially along a length of the optical fiber device. The optical fiber device also comprises an optical fiber cladding that surrounds the crystalline core and extends axially along a length of the optical fiber device. The optical fiber device further comprises a pair of conductors symmetrically disposed in the optical fiber cladding about an axial center of the crystalline core and extending along a length of the optical fiber device. The pair of conductors can be configured to generate an electric field through the crystalline core in response to electrical signals.

Another embodiment of the invention includes an optical fiber device. The optical fiber device comprises a crystalline core that extends axially along a length of the optical fiber device. The optical fiber device also comprises an optical fiber cladding that surrounds the crystalline core and extends axially along a length of the optical fiber device. The optical fiber device further comprises a conductor that is disposed in the optical fiber cladding and extends helically around the crystalline core along a length of the optical fiber. The conductor can be configured to generate a magnetic field along the length of the optical fiber device through the crystalline core in response to a current provided through the conductor.

BRIEF DESCRIPTION OF THE DRAWINGS

FIG. 1 demonstrates an example of a preform for forming an optical fiber in accordance with an aspect of the invention.

FIG. 2 demonstrates an example of core-drilling a core material rod for forming an optical fiber in accordance with an aspect of the invention.

FIG. 3 demonstrates an example of a system for forming an optical fiber in accordance with an aspect of the invention.

FIG. 10 demonstrates an example of a preform for forming an optical fiber device in accordance with an aspect of the invention.

FIG. 11 demonstrates an example of an optical fiber device in accordance with an aspect of the invention.

FIG. 12 demonstrates an example of a system for forming an optical fiber device in accordance with an aspect of the invention.

DETAILED DESCRIPTION

Figure 5:
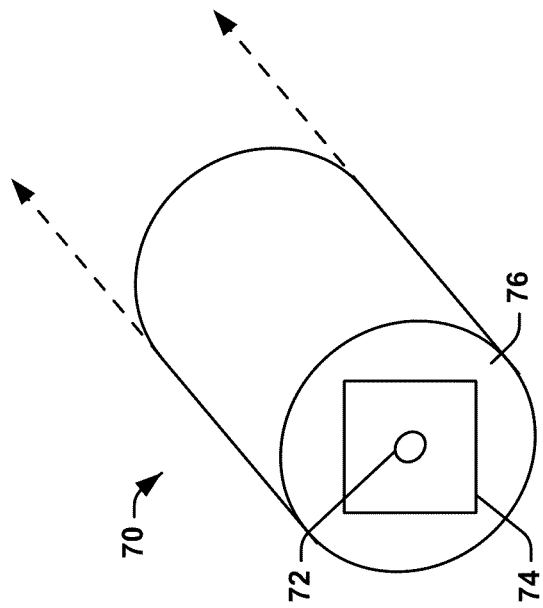
FIG. 5 demonstrates another example of an optical fiber in accordance with an aspect of the invention.

The present disclosure relates generally to optics, and more particularly to optical fiber systems and methods. An optical fiber can be formed having a crystalline core. A crystalline core can exhibit a Raman gain from approximately 1,000 to 10,000 times that which can be achieved in an amorphous fused silica core. As a result, a fiber amplifier can achieve a significant Raman gain with a much shorter fiber length than a typical fiber amplifier having a fused silica core. In addition, because optical signals that are launched into an amplifier as disclosed herein can achieve such significant amplification, optical pump energy can be significantly reduced to achieve optical signals of a similar magnitude using typical fiber amplifiers.

It is to be understood that, as described herein, the term "crystalline" generally refers to polycrystalline as well as single crystal materials. Accordingly, use of the term "crystalline" is not intended to exclude either polycrystalline materials or single crystal materials unless specifically described as such. In addition, the term "single crystal" generally refers to a crystalline material that does not include grain boundaries within the material. For example, a single crystal core can include substantially no grain boundaries within that length of the fiber that includes the termed "single crystal core."

Crystalline core fiber amplifiers can be formed, for example, by drawing a preform that includes a cladding material and a core material under temperature conditions at which the core material becomes molten and the clad material can be drawn. Upon cooling, the core material can spontaneously crystallize. The drawing process can provide single crystal core fiber amplifiers, as well as polycrystalline fiber amplifiers. In addition, other types of fiber amplifiers and/or optical fibers can be formed. As an example, an optical fiber device can be formed that includes one or more conductors that extend axially along the length of the fiber. For example, an optical fiber device can be formed with two conductors that are oppositely disposed in the cladding relative to the center of the core, such that electrical signals applied to the conductors can generate an electric field through the core, such as for electro-optical phase modulation. As another example, a single conductor can be disposed in the cladding and extend helically around the core along the length of the optical fiber device. As such, a current that is provided to the conductor can generate a magnetic field through the core, such as to provide polar rotation of the optical signal therein.

FIG. 1 demonstrates an example of a preform 10 for forming an optical fiber in accordance with an aspect of the invention. The preform 10 includes a core material 12 and a cladding material 14. Therefore, the preform 10 can be drawn to form an optical fiber. The cladding material 14 can be any of a variety of glass materials. For example, the cladding material 14 can include oxide glasses, such as silicate glasses, phosphate glasses, germanate glasses, and the like. As another example, the cladding material 14 can include halide glasses, such as fluoride glasses. As yet another example, the cladding material 14 can include chalcogenides, such as sulfide glasses, selenide glasses, telluride glasses, and the like. By way of example, silica glass, borosilicate glass, and so forth can be utilized in forming the cladding material 14. Furthermore, the cladding material 14 can be doped with any of a variety of dopants to achieve a desired refractive index.

The core material 12 can be any of a variety of materials that can crystallize upon cooling from a molten state. For example, the core material 12 can be a semiconductor material. By way of example, the core material 12 can be any of a variety of Type IV elements or compounds, such as Silicon (Si), Germanium (Ge), or SiGe. As another example, the core material 12 can be any of a variety of Type III-V compounds, such as Gallium-Arsenide (GaAs) or Indium Phosphate (InP), or any of a variety of Type II-VI compounds, such as Cadmium Sulfide (CdS), Cadmium Selenide (CdSe), Zinc Sulfide (ZnS), or Zinc Selenide (ZnSe). In one embodiment, the core material 12 can be a linear electro-optic material, such as, without limitation, ZnSe, ZnTe, $Bi_{12}SiO_{20}$, $KH_2PO_4$, $KD_2PO_4$, $CsH_2AsO_4$, $BaTiO_3$, $SrTiO_3$, $KTa_{0.35}Nb_{0.65}O_3$, $Ba_{0.25}Sr_{0.75}Nb_2O_6$, $LiNbO_3$, $LiTaO_3$, $Ag_3AsS_3$, $KNbO_3$, and so forth. The core material 12 can be a magneto-optic material including, without limitation, lanthanum gallium garnet ($La_3Ga_5O_{12}$, LGG), gadolinium gallium garnet ($Gd_3Ga_5O_{12}$, GGG), terbium gallium garnet ($Tb_3Ga_5O_{12}$, TGG), magneto-optical glasses MOS-4 and MOS-10, and so forth. Furthermore, core material 12 can also include one or more dopant materials, such as Chromium (Cr), Nickel (Ni), selected rare earth elements, transition metals, and so forth. For instance, the core material 12 can be N- or P-doped.

The core material 12 can be provided in any suitable form. For instance, the core material 12 can be a crystalline material (i.e., a single crystal or polycrystalline material) or can be an amorphous material. As an example, the core material 12 can be provided in the preform 10 in the form of a solid rod. However, the core material 12 can be provided in the perform 10 in other manners, as well. For example, the core material 12 can be provided in the preform 10 as a plurality of chips, all of which can have the same or different composition, as a powder, or in any other form.

As described in greater detail below, the preform 10 can be drawn to form an optical fiber having a single crystal or polycrystalline core. Based on the core of the resultant optical fiber being crystalline, the resultant optical fiber can exhibit a Raman gain from approximately 1,000 to 10,000 times that which can be achieved in a fused silica core. Therefore, a resultant optical fiber can be formed with significantly shorter lengths to achieve similar desired Raman amplification relative to typical fiber amplifiers. The increased Raman gain can also result in a substantial reduction in pump power necessary to achieve similar levels of amplification relative to typical fiber amplifiers. In addition, a resultant optical fiber can maintain a substantially narrow Raman linewidth, as well as wide wavelength range of the optical signal, such as from tunable mid-wavelength infrared (MWIR) sources.

A preform 10 can be formed by first forming the cladding material 14 with the desired geometry. In the example of FIG. 1, the cladding material 14 is demonstrated as substantially cylindrical. However, it is to be understood that the cladding material 14 can have any of a variety of cross-sectional shapes, such as rectangular, elliptical, or "D"-shaped. As an example, a hole can be drilled in the cladding material 14, such as substantially at a center axis or cross-sectional centroid of the cladding material 14 to form a tubular shape, as illustrated in the example of FIG. 1.

The core material 12 can be in any suitable starting formation, such as a boule, window, slug, a plurality of chips, a powder, and so forth. For example, the core material 12 can be core-drilled from a boule or window. FIG. 2 demonstrates an example of core-drilling a core material 12 in the form of a rod for forming an optical fiber in accordance with an aspect of the invention. In the example of FIG. 2, a rod of the core material 12 is core-drilled from a boule 16. As an example, the boule 16 can be a mass of single crystal or polycrystalline material that is grown, such as from a seed. As another example, the boule 16 can be a substantially amorphous mass of semiconductor material. As described herein, the term "core-drilling" can refer to the use of a cylindrical core-drill, or can refer to boring, pressing, and/or stamping a boule 16 to generate a rod of the core material 12. Although the example of FIG. 2 demonstrates that the boule 16 is cubical in shape, it is to be understood that a boule can have any of a variety of shapes, such as substantially cylindrical or spherical.

Referring back to the example of FIG. 1, the core material 12 can be inserted or "sleaved" in a hole that has been drilled into the cladding material 14. It is to be understood that core-drilling to obtain a rod of the core material 12, as demonstrated in the example of FIG. 2, and sleaving the rod of core material 12 into the cladding material 14 is one of a variety of different ways to form the preform 10. As an example, the preform 10 can be formed by vapor deposition of the core material 12 in the hole that has been drilled into the cladding material 14. As another example, the hole can be filled with the core material 12 in the form of a powder or a plurality of chips to locate the core material 12 within the cladding material 14. Thus, the preform 10 can be generated in any of a variety of ways. The resultant preform 10 can be drawn into an optical fiber, such as via a fiber drawing tower.

FIG. 3 demonstrates an example of a system 20 for forming an optical fiber in accordance with an aspect of the invention. The system 20 demonstrates a preform 22 that includes a cladding material 24 and a core material 26, such as similar to the preform 10 in the example of FIG. 1. For example, the cladding material 24 can be a glass and the core material 26 can be a crystalline or amorphous semiconductor material. In the example of FIG. 3, the preform 22 is being drawn to form an optical fiber 28.

The system 20 includes a hot zone 30, such as can be included in a fiber drawing tower furnace. As an example, the hot zone 30 can apply heat that is sufficient to soften the cladding material 24 and to melt the core material 26. Specifically, the hot zone 30 can be set to a temperature that is above the melting point of the core material 26 and at which the cladding material 24 is sufficiently soft so as to draw as desired. Temperatures for the heat zone 30 during a drawing process can depend upon materials included in the preform 22, the size of the preform 22 and the fiber 28, and the like.

The draw temperature at which the core material 26 is molten and the clad material 24 is at a viscosity to provide an acceptable draw can be only slightly above the melting temperature of the core material 26. For instance, the draw temperature can be about 1° C. above the melting temperature of the core material 26. For example, the melting temperature of the core material 26 and the targeted drawing temperature of the cladding material 24 can be quite close to one another. However, as an alternative example, the drawing temperature of the hot zone 30 could instead be considerably higher than the melting temperature of the core material 26, such as greater than 50° C. higher or more. Furthermore, the expansion coefficients of the core material 26 and the cladding material 24 can be substantially similar, or even substantially the same. However, it is to be understood that the expansion coefficient of the core material 26 and the cladding material 26 can differ greatly.

According to the example of FIG. 3, the preform 22 can be drawn from a first end 32 to form the optical fiber 28. During the draw process, the soft but non-molten cladding material 24 can act as a crucible to confine the molten core material 26 as it is drawn into the optical fiber 28 and solidified upon cooling. The resultant optical fiber 28 can thus cool to form a crystalline (i.e., single crystal or polycrystalline) core without requiring the use of a crystal seed. The resultant crystalline core can be single-mode or multimode. The optical fiber 28 can be wound around a take-up reel 34 as it leaves the hot zone 30, such that it can cool and solidify. The optical fiber 28 can subsequently be run through a polymer bath (not shown), such that a jacketing material can be coated onto the optical fiber 28.

The resultant optical fiber 28 can thus propagate a variety of different types of optical signals, such as passive MWIR, long-wavelength infrared (LWIR), or terahertz (THz) propagation. The optical fiber 28 can thus be implemented in a variety of applications. As an example, the optical fiber 28 can be implemented as a Raman gain amplifier, such as in a communications or imaging system. As another example, the optical fiber 28 can be implemented in any of a variety of laser applications. Furthermore, as described in greater detail below, variations of the optical fiber 28 can be implemented in electro-optic fiber modulators or fiber Faraday isolators.

It is therefore demonstrated in the example of FIG. 3 that fabrication of an optical fiber 28 from the preform 22 can be accomplished in a facile manner. Specifically, upon forming the preform 22, the resultant optical fiber 28 can be formed in a manner similar to typical fiber amplifiers that have an amorphous core material. However, as described above, the optical fiber 28 can exhibit superior optical performance due to the crystalline material core. It is to be understood that the system 20 in the example of FIG. 3 is demonstrated simplistically, and that any of a combination of fiber forming techniques can be implemented in forming the resultant optical fiber 28. Therefore, the system 20 is not intended to be limited to the example of FIG. 3.

Figure 4:
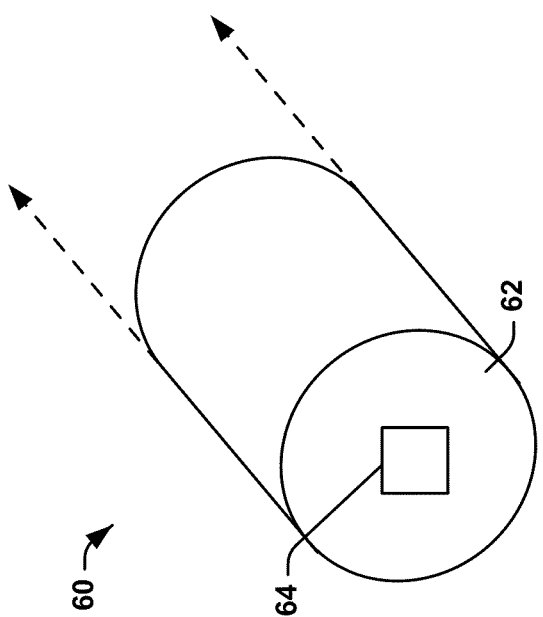
FIG. 4 demonstrates another example of an optical fiber in accordance with an aspect of the invention.

It is to be understood that the core material of a given preform, such as the preform 10 in the example of FIG. 1, is not limited to having a circular cross-section. FIG. 4 demonstrates another example of an optical fiber 60 in accordance with an aspect of the invention. The optical fiber 60 can be a resultant optical fiber, similar to the resultant optical fiber 28 in the example of FIG. 3. The optical fiber 60 includes a cladding 62 and a core 64. The cladding 62 can be a glass material. The core 64 can be a crystalline material, similar to as described above in the examples of FIGS. 1 through 3.

However, in the example of FIG. 4, the core 64 is demonstrated as having a substantially rectangular (e.g., square) cross-section.

Such a rectangular cross-sectional core 64 can be implemented in the optical fiber 60 such that the optical fiber 60 has a large index contrast. As an example, the optical fiber 60 can be implemented as a small signal image amplifier for a Talbot self-imaging length with a non-depleted pump. As another example, the optical fiber 60 can be implemented as a high power beam combiner at high pumping levels. The forming of the core 64 from the crystalline material can thus result in a very efficient high power beam combiner.

FIG. 5 demonstrates another example of an optical fiber 70 in accordance with an aspect of the invention. The optical fiber 70 can be a resultant optical fiber, such as the resultant optical fiber 28 in the example of FIG. 3. The optical fiber 70 includes a cladding 76, a pump cladding 74, and a core 72. The cladding 76 and the pump cladding 74 can each be formed from a glass material, such as different respective glass materials or the same glass material with different dopants, and the core 72 can be formed from a crystalline material, similar to as described above in the examples of FIGS. 1 through 3. The core 72 can be configured as a multimode core.

In the example of FIG. 5, the pump cladding core 74 is demonstrated as having a substantially rectangular (e.g., square) cross-section, and is configured to receive pumped optical energy. As a result, Raman gain in the multimode core 72 can be efficiently saturated by the injected Stokes wavelength signal that is provided in the pumped optical energy. Accordingly, self-imaging in the multimode core 72 can generate a diffraction limited beam. In addition, the configuration of the optical fiber 70 can enable the pump cladding 74 to be substantially large for practical lengths of the optical fiber 70.

Figure 6:
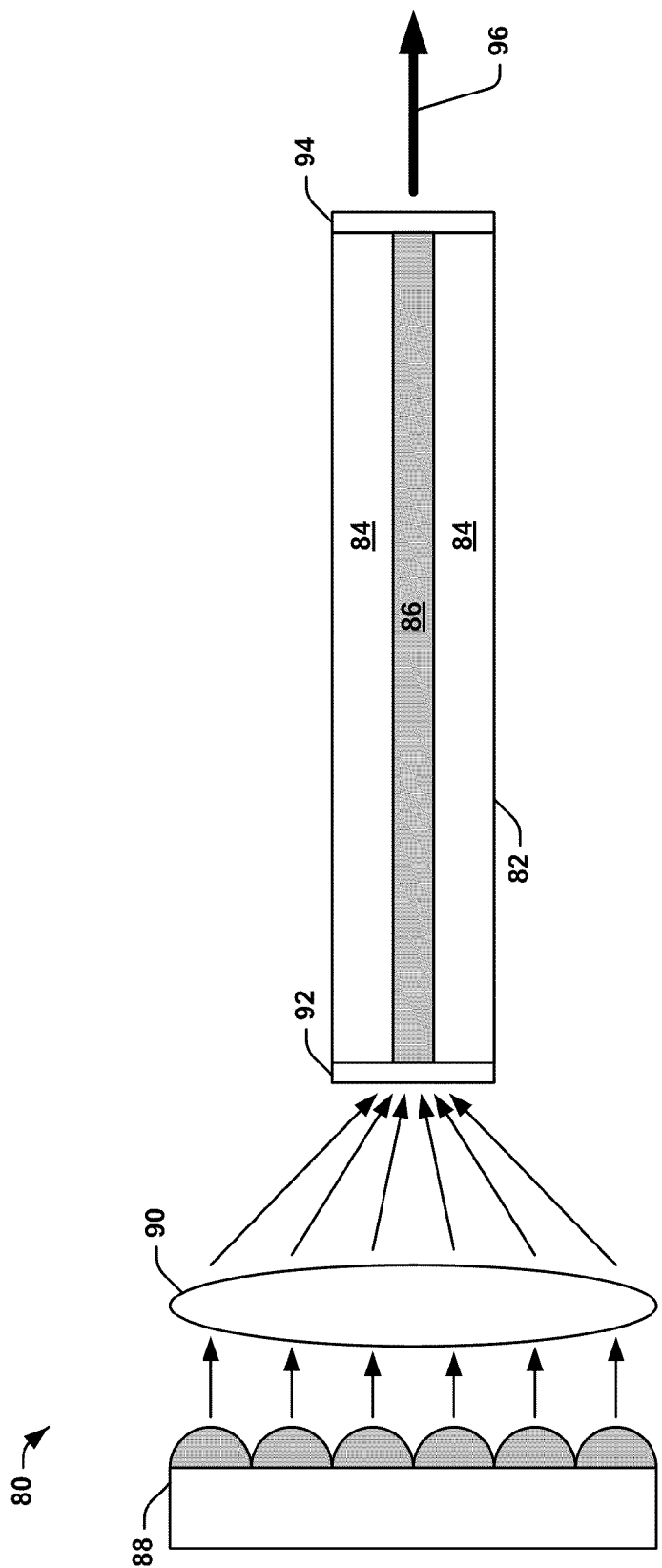
FIG. 6 demonstrates an example of an optical system in accordance with an aspect of the invention.

FIG. 6 demonstrates an example of an optical system 80 in accordance with an aspect of the invention. The optical system 80 can be implemented in any of a variety of optical applications, such as for optical network communications or for optical imaging systems. The optical system 80 includes an optical fiber 82, such as the resultant optical fiber 28 in the example of FIG. 3. Therefore, the optical fiber 82 includes a cladding 84 which can be formed from glass, and a core 86 that can be formed from a crystalline material.

In the example of FIG. 6, the optical fiber 82 can be configured as a Raman gain amplifier. Therefore, a laser diode pump array 88 is configured to provide high brightness pump radiation to a focusing mirror 90. The focusing mirror 90 thus focuses the pump radiation and launches it into the optical fiber 82 through a high reflectivity mirror 92. A partially transmitting output mirror 94 is coupled to the optical fiber 82 at an opposite end of the optical fiber 82 from the high reflectivity mirror 92. As a result, the high brightness pump radiation oscillates between the high reflectivity mirror 92 and the partially transmitting output mirror 94. Accordingly, the oscillating pump power results in a high efficiency conversion of the pump power to an output beam 96 through the partially transmitting output mirror 94.

As described above, the core 86 can be formed from a crystalline material. Therefore, the optical fiber 82 can exhibit a Raman gain of approximately 1,000 to 10,000 times that of a typical optical fiber. As a result, the optical system 80 is implemented as a direct diode pumped Raman oscillator. Typical optical fibers, such as including a fused silica core, do not have a sufficient gain to be implemented as a direct diode pumped Raman oscillator with available pump brightness. However, the substantially greater Raman gain that is exhibited by the optical fiber 82 relative to typical fiber amplifiers permits such a low-threshold direct diode pumped Raman fiber oscillator, as demonstrated in the example of FIG. 6.

It is to be understood that the optical system 80 is not limited to the example of FIG. 6. As an example, the optical system 80 is demonstrated simplistically in the example of FIG. 6. As such, additional optical components, such as additional lenses and/or mirrors can be included in the optical system 80. Therefore, the optical system 80 can be configured in any of a variety of ways, and can be implemented in any of a variety of optical applications.

Figure 7:
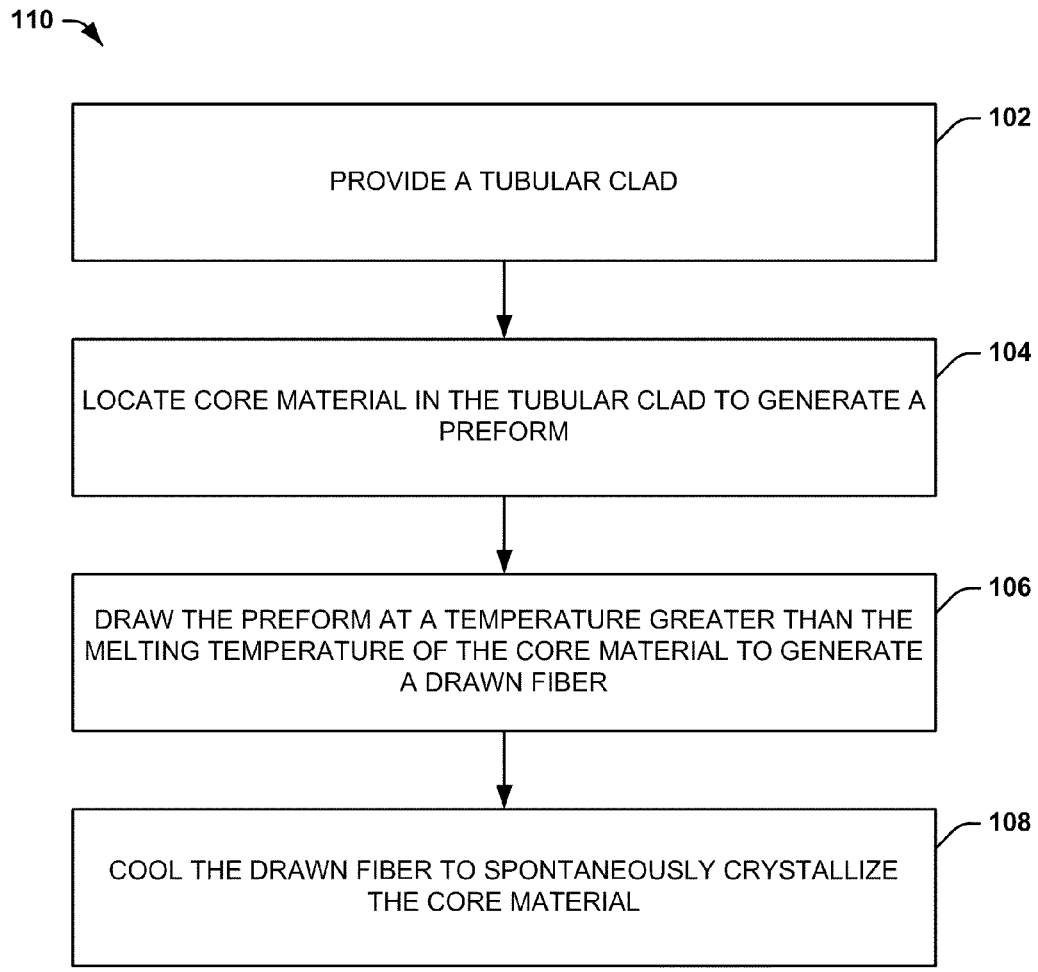
FIG. 7 demonstrates a method for forming an optical fiber in accordance with an aspect of the invention.

In view of the foregoing structural and functional features described above, a methodology in accordance with various aspects of the present invention will be better appreciated with reference to FIG. 7. While, for purposes of simplicity of explanation, the methodologies of FIG. 7 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 demonstrates a method 100 for forming an optical fiber in accordance with an aspect of the invention. At 102, a cladding material in a tubular form is provided. The cladding material can be glass, and can be formed into a variety of cross-sectional shapes, such as circular, elliptical, or substantially "D"-shaped. At 104, a core material is located in the hole of the tubular clad. The core material can be in the form of a single rod, or can be other forms, as described above. For example, the core material can be formed from a single crystal, polycrystalline, or amorphous semiconductor boule or window, and can be shaped to fit in the hole that is drilled in the cladding material. For example, a core material rod can be core-drilled from a boule or window to fit the hole in the cladding material and can be inserted into the hole of the cladding material to form a preform. The insertion can be such that the core material rod is sleaved within the cladding material. The core material can also be formed in the cladding material hole in a variety of other ways, such as vapor deposition or elemental material powder or chips that can be located in the hole. At 106, the preform can be drawn from a first end to form an optical fiber. The drawing of the preform can be through a hot zone that has a temperature that is sufficient to soften the cladding material and to melt the core material. At 108, upon cooling, the resultant optical fiber has a crystalline core that is surrounded by a cladding, such that the resultant optical fiber can be implemented in any of a variety of optics applications.

Figure 8:
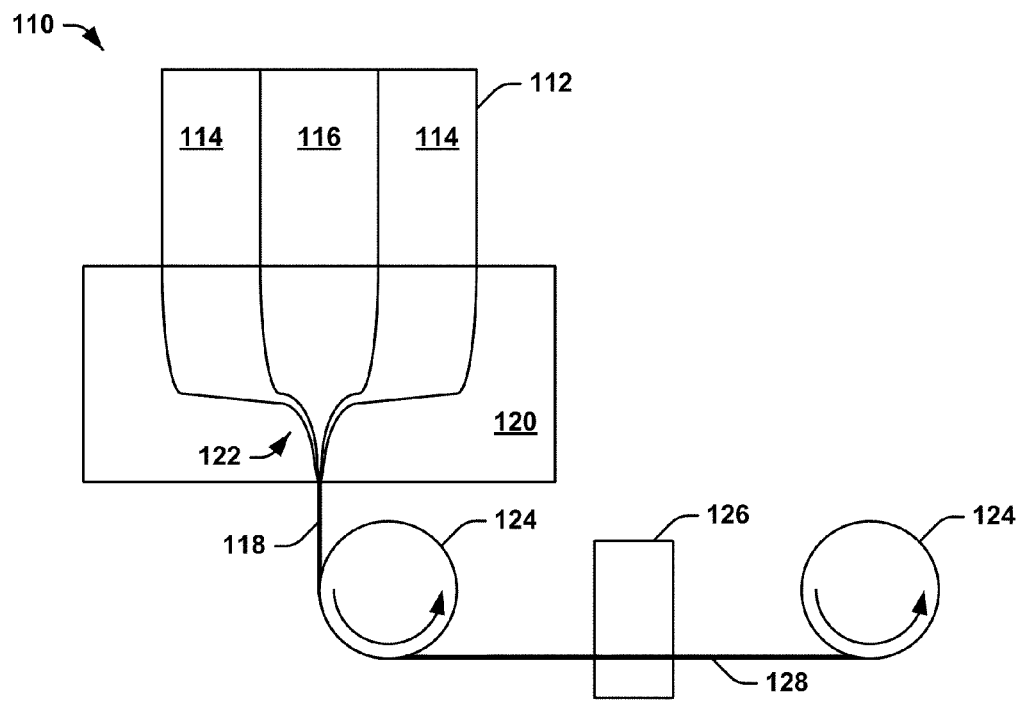
FIG. 8 demonstrates another example of a system for forming an optical fiber in accordance with an aspect of the invention.

FIG. 8 demonstrates another example of a system 110 for forming an optical fiber in accordance with an aspect of the invention. The system 110 demonstrates a preform 112 that includes a cladding material 114 and a core material 116. As such, the preform 112 is configured substantially similar to the preform 10 in the example of FIG. 1. The cladding material 114 can be a glass and the core material 116 can be, for example, a single crystal, polycrystalline, or amorphous semiconductor material. In the example of FIG. 8, the preform 112 is being drawn to form a first optical fiber portion 118.

The system 110 includes a first hot zone 120, such as can be included in a fiber drawing tower furnace. As an example, the first hot zone 120 can apply heat that is sufficient to soften the cladding material 114 and to melt the core material rod 116. Thus, the preform 112 is stretched from a first end 122 to form the first optical fiber portion 118. The first optical fiber portion 118 can be wound around a first take-up reel 124 as it leaves the first hot zone 120, such that it can cool and solidify. Upon cooling, the first optical fiber portion 118 can have a crystalline core that can be single mode or multimode.

As described above, the core material 116 can melt as it passes through the first hot zone 120. Therefore, even if the core material 116 is formed from a single crystal material, the resultant core of the first optical fiber portion 118 can become polycrystalline as it cools. Accordingly, the first optical fiber portion 118 can be unwound from the first take-up reel 124 and passed through a second hot zone 126. The second hot zone 126 can have a temperature that is less than the first hot zone 120, such as at an approximate crystallization temperature of the crystalline material of the core of the first optical fiber portion 118. As an example, the temperature can be substantially near (e.g., just below) the melting point of the crystalline material core of the first optical fiber portion 118.

The core of the first optical fiber portion 118 recrystallizes as it passes through the second hot zone 126. Therefore, a resultant optical fiber 128 can be output from the second hot zone 126 having a single crystal core. The resultant single crystal core optical fiber 128 can be wound around a second take-up reel 130 as it leaves the second hot zone 126, such that it can cool. The resultant optical fiber 128 can subsequently be run through a polymer bath (not shown), such that a jacketing material can be coated onto the resultant optical fiber 128.

Figure 9:
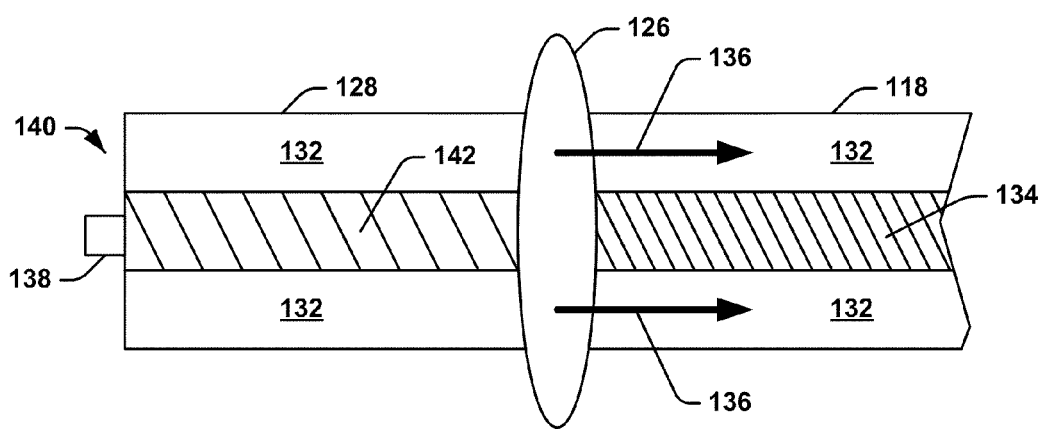
FIG. 9 demonstrates an example of recrystallization in forming an optical fiber in accordance with an aspect of the invention.

FIG. 9 demonstrates an example of recrystallization in forming the resultant optical fiber 128 in accordance with an aspect of the invention. In the example of FIG. 9, the first optical fiber portion 118 is demonstrated in a longitudinal cross-section as having a cladding 132 and a polycrystalline core 134. The second hot zone 126 is depicted as moving relative to the first optical fiber portion 118 to form the resultant optical fiber 128, as demonstrated by the motion arrows 136. The motion 136 of the second hot zone 126 can result from the first optical fiber portion 118 moving through the second hot zone 126. Alternatively, the second hot zone 126 could move relative to a stationary first optical fiber portion 118.

In the example of FIG. 9, a single crystal seed 138 of the same type as the crystalline material of the core 134 of the first optical fiber portion 118 could be placed at a leading end 140 of the first optical fiber portion 118, for example, prior to or concurrently with the first optical fiber portion 118 entering the second hot zone 126. Accordingly, the seed 138 could template an orientation of the crystalline material of the core 134 of the first optical fiber portion 118, such as for an anisotropic crystalline material. Therefore, the orientation of the lattice structure of the core 134 of the first optical fiber portion 118 could become substantially aligned with the lattice of the single crystal seed 138 as the first optical fiber portion 118 passes through the second hot zone 126. Thus, the lattice structure of subsequent portions of the core 134 of the first optical fiber portion 118 entering the second hot zone 126 can align with the newly aligned portions, and so forth for subsequent portions of the core 134 entering the second hot zone 126. Accordingly, the resultant optical fiber 128 has a single crystal core 142 upon cooling, for instance on the second take-up reel 130. It is to be understood that the example of FIG. 9 is not limited to the use of the single crystal seed 138 for aligning the crystalline material of the core 134, but that the use of the seed 138 could be omitted, or the alignment of the crystalline material of the core 134 could be implemented in a variety of other ways.

Having the core 142 of the resultant optical fiber 128 being crystalline allows for a substantially more effective polarization of the core 142. As a result, as demonstrated in greater detail below, a variety of optical devices can be implemented with the resultant optical fiber 128. As an example, Chi-2 devices such as frequency doublers, optical parametric amplifiers, electro-optical modulators, Faraday isolators, interferometric microwave sensors, and phase modulated lasers can be manufactured using the resultant optical fiber 128. Such devices can be substantially more efficient when implementing Chi-2 processes within an optical fiber as opposed to implementation within bulk crystals or planar waveguides.

In addition, similar to as described above in the example of FIGS. 1 though 3, such a crystalline material within the core 142 of the resultant optical fiber 128 can provide significantly more gain than in typical optical fibers. Also, the system 110 can be implemented to form optical fibers of any of a variety of different types, such as the optical fibers 60 and 70 of the examples of FIGS. 4 and 5, respectively. Furthermore, the system 110 can be implemented to allow for batch processing of multiple fibers that each have a single crystal core.

It is to be understood that the system 110 is not intended to be limited to the example of FIGS. 8 and 9. Specifically, the system 110 is demonstrated simplistically in the example of FIGS. 8 and 9, such that any of a variety of fiber forming techniques can be implemented in forming the resultant optical fiber 128. In addition, the first hot zone 120 and the second hot zone 126 may be implemented together. As an example, a common furnace could include separate heating elements corresponding to each of the first and second hot zones 120 and 126, such that the first optical fiber portion 118 cools from a core-melting temperature to a recrystallization temperature directly for the forming of the single crystal core 142. Therefore, the system 110 can be configured in any of a variety of ways.

FIG. 10 demonstrates an example of a preform 160 for forming an optical fiber device in accordance with an aspect of the invention. The preform 160 includes a core material 162 and a cladding material 164. The preform 160 also includes a first conductive material 166 and a second conductive material 168 formed at two separate locations in the preform 160. In the example of FIG. 10, the first and second conductive materials 166 and 168 are disposed symmetrically about the cross-sectional center of the preform 160. As another example, the conductive materials 166 and 168 need not be disposed symmetrically about the central axis of the preform 160. The first and second conductive materials 166 and 168 can be any of a variety of conductive materials, such as aluminum, copper, gold, platinum, or silver.

The preform 160 can be formed by first forming the cladding material 164 to the desired geometry. In the example of FIG. 10, the cladding material 164 is demonstrated as substantially cylindrical. However, it is to be understood that the cladding material 164 can be formed to have any of a variety of cross-sectional shapes, such as rectangular, elliptical, or "D"-shaped. Holes can be drilled in the cladding material 164, such as one hole substantially at a center axis or cross-sectional centroid of the cladding material 164, and two holes symmetrically disposed with respect to the center hole. The core material 162 can be formed, inserted, or sleeved in the center hole that has been drilled into the cladding material 164, and the first and second conductive materials 166 and 168 can be inserted into the symmetrically disposed holes. The resultant preform 160 can then be drawn into a resultant fiber, such as via a fiber drawing tower.

FIG. 11 demonstrates an example of an optical fiber device 170 in accordance with an aspect of the invention. The optical fiber device 170 can be an optical fiber device resulting from drawing the preform 160 in the example of FIG. 10. The optical fiber device 170 is demonstrated in the example of FIG. 10 as having a cladding 172, a core 174, a first conductor 176, and a second conductor 178. As an example, the cladding 172 can be formed from glass, the core 174 can be a crystalline material, and the first and second conductors 176 and 178 can be any of a variety of conductive materials. In the example of FIG. 11, the core 174 is demonstrated as having a substantially circular cross-section. However, it is to be understood that the core 174 can have any of a variety of cross-sectional shapes, such as rectangular or elliptical. In addition, the core 174 can be a dual-core, such as the core 74 in the example of FIG. 5. Furthermore, the optical fiber device 170 is not limited to having two conductors, the first and second conductors 176 and 178, but could instead have a single conductor or could include three or more conductors.

The first and second conductors 176 and 178 in the example of FIG. 11 can be configured to carry electrical currents for a variety of purposes. As an example, the first and second conductors 176 and 178 can be used to carry signals or power. As another example, the first and second conductors 176 and 178 can be configured to implement electro-optical effects on an optical signal that is propagated on the core 174. As an example, the core 174 can be a crystalline core, such as the single crystal core 186 in the example of FIG. 12 described below, that is polarized via a polarization process. Therefore, electrical signals that are applied to the first and second conductors 176 and 178 can generate an electric field through the polarized crystalline core 174 to vary a propagation speed of the optical signal therein. Accordingly, phase modulation of an optical signal can be achieved directly in an optical fiber, as opposed to a bulk optical element or planar waveguide element, based on the electro-optical effects that can be implemented via the first and second conductors 176 and 178.

FIG. 12 demonstrates an example of a system 180 for forming an optical fiber device in accordance with an aspect of the invention. The system 180 demonstrates a preform 182 that includes a cladding material 184, a core material 186, a first conductive material 188, and a second conductive material 190. As such, the preform 182 is configured substantially similar to the preform 160 in the example of FIG. 10. The cladding material 184 can be glass and the core material rod 186 can be a crystalline semiconductor material. In the example of FIG. 12, the preform 182 is being drawn to form an optical fiber device 192.

The system 180 includes a hot zone 194, such as can be included in a fiber drawing tower furnace. As an example, the hot zone 194 can apply heat that is sufficient to soften the cladding material 184 and first and second conductive materials 188 and 190 and to melt the core material 186. Thus, the preform 182 is drawn from a first end 196 to form the optical fiber device 192. The resultant optical fiber device 192 can thus have a crystalline core that can be single-mode or multimode. The optical fiber device 192 can be wound around a take-up reel 198 as it leaves the hot zone 194, such that it can cool and solidify.

The system 180 also includes a polarization system 200. The polarization system 200 includes a second hot zone 202 that is configured to apply heat at an approximate Curie temperature to the optical fiber device 192. As a result, the optical fiber device 192 loses innate polarization and dipole effects within the crystal lattice of the resultant core of the optical fiber device 192. The polarization system 200 also includes a first rolling electrode 204 and a second rolling electrode 206. As demonstrated in the example of FIG. 12, the first rolling electrode 204 has a positive voltage potential and the second rolling electrode 206 has a negative voltage potential. The first and second rolling electrodes 204 and 206 roll the optical fiber device 192 through the second hot zone 202. As the optical fiber device 192 exits the second hot zone 202 and cools, the crystalline core of the optical fiber device 192 experiences a spontaneous polarization effect. Accordingly, the optical fiber device 192 can be implemented for electro-optical applications, such as phase-modulation or frequency conversion. The polarized optical fiber device 192 can then be wound around a second take-up reel 208. The optical fiber device 192 can subsequently be run through a polymer bath (not shown), such that a jacketing material can be coated onto the optical fiber device 192.

It is to be understood that the system 180 is not intended to be limited to the example of FIG. 12. Specifically, the system 180 is demonstrated simplistically in the example of FIG. 12, such that any of a variety of fiber forming techniques can be implemented in forming the resultant optical fiber device 192. Accordingly, the polarization of the optical fiber device 192 can be more effective, resulting in more efficient electro-optical effects. Therefore, the system 180 can be configured in any of a variety of ways.

Figure 13:
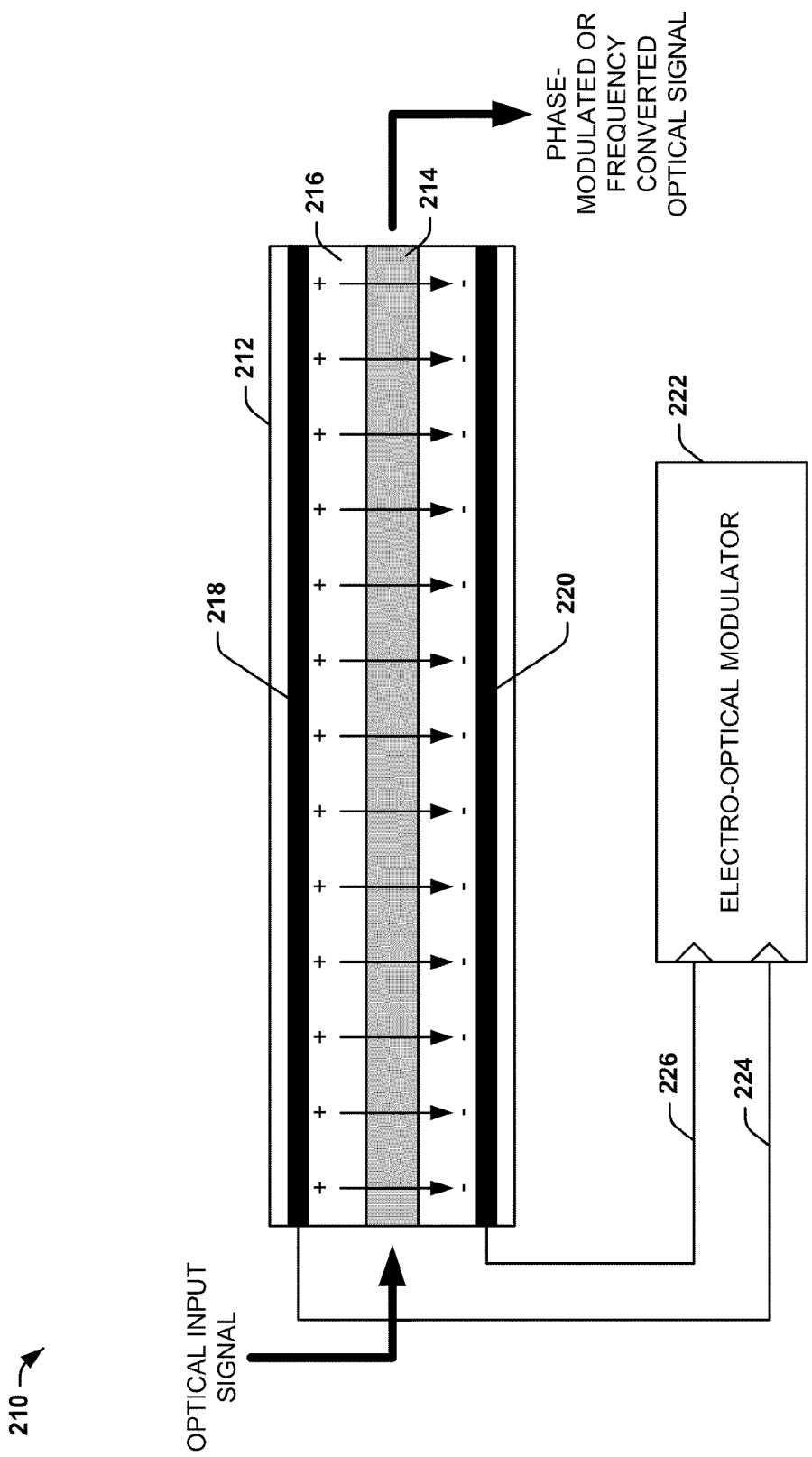
FIG. 13 demonstrates another example of an optical system in accordance with an aspect of the invention.

FIG. 13 demonstrates another example of an optical system 210 in accordance with an aspect of the invention. The optical system 210 can be implemented in any of a variety of optics applications. The optical system 210 includes an optical fiber device 212. The example of FIG. 13 demonstrates a longitudinal cross-section of the optical fiber device 212.

The optical fiber device 212 includes a core 214, a cladding 216, a first conductor 218, and a second conductor 220. The cladding 214 can be glass material, and the core 214 can be a crystalline material. As an example, the core 214 can be a single crystal material. The first and second conductors 218 and 220 can be any of a variety of conductive materials, such as aluminum, copper, gold, platinum, or silver. Therefore, the optical fiber device 212 can be substantially similar to the resultant optical fiber device 192 demonstrated in the example of FIG. 12.

The optical system 210 includes an electro-optical modulator 222. The electro-optical modulator 222 is coupled to the first and second conductors 218 and 220 via respective conductive leads 224 and 226. The electro-optical modulator 222 is thus configured to apply electrical signals to the first and second conductors 218 and 220 via the respective leads 224 and 226. Therefore, an electric field can be generated through the core 214. In the example of FIG. 13, the electric field is demonstrated based on a positive voltage potential on the first conductor 218 and a negative voltage potential on the second conductor 220. The electric field thus generates a dipole moment in the unit cells of the lattice structure of the crystalline core 214, which allows linear control of electro-optical effects on an optical input signal.

Therefore, by controlling electro-optical effects of the optical input signal via the electro-optical modulator 222, the optical input signal can be phase-modulated to generate a phase-modulated or frequency converted optical signal. The optical signal can occupy a variety of wavelength spectrums, such as visible light, near infrared (NIR), eye-safe NIR, and MWIR. In addition, based on the core 214 being crystalline, such as an acentric crystal material, significantly higher electro-optic coefficients can be achieved in the fiber, such that electro-optic modulation or frequency conversion can be achieved at substantially lower power levels. Furthermore, because the electro-optical effects are implemented in the optical fiber device 212, as opposed to a bulk crystal or planar waveguide element, the electro-optical effects can be implemented in long propagation lengths.

Figure 14:
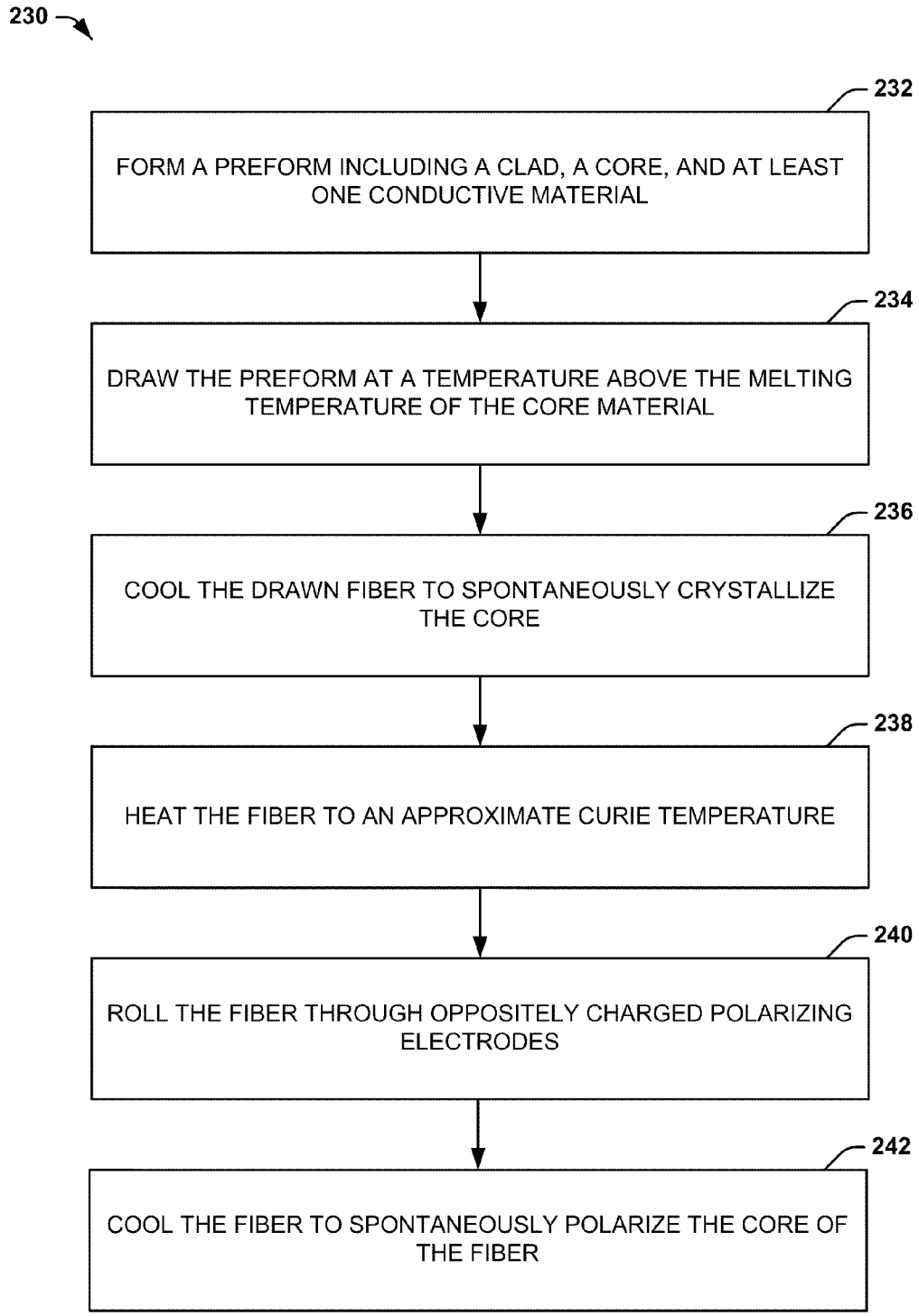
FIG. 14 demonstrates an example of a method for forming an optical fiber device in accordance with an aspect of the invention FIG. 15 demonstrates another example of a preform for forming an optical fiber device in accordance with an aspect of the invention.

In view of the foregoing structural and functional features described above, a methodology in accordance with various aspects of the present invention will be better appreciated with reference to FIG. 14. While, for purposes of simplicity of explanation, the methodologies of FIG. 14 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 14 demonstrates another example of a method 230 for forming an optical fiber device in accordance with an aspect of the invention. At 232, a preform is formed from a cladding material, a core material, and at least one conductive material. The cladding material can be a glass, and can be formed into a variety of cross-sectional shapes, such as circular, elliptical, or substantially "D"-shaped. The core material can be formed from an amorphous or crystalline material boule. The at least one conductive material can be any of a variety of conductive materials, such as aluminum, copper, gold, platinum, or silver. Holes can be drilled at specific locations in the cladding material for insertion of the core material and the conductive materials. As an example, the core material can be inserted in an approximate centroid or axial center of the cladding material, and the conductive materials can be disposed at a specific radius of the cladding material. For example, two conductive material rods can be disposed at symmetrical locations in the cladding material relative to an axial center of the cladding material.

At 234, the preform is drawn from a first end to form an optical fiber device. The drawing of the preform can be through a hot zone that has a temperature that is sufficient to soften the cladding material and conductive materials and to melt the core material. At 236, the optical fiber device is cooled and the molten core material spontaneously crystallizes to form a crystal core fiber. At 238, the optical fiber device is heated to an approximate Curie temperature. The optical fiber device can be passed through a second hot zone that heats the optical fiber device to the approximate Curie temperature, such that innate polarization and dipole effects are removed.

At 240, the optical fiber device is rolled through oppositely charged polarizing electrodes. The oppositely charged polarizing electrodes can be located in the second hot zone, such that the optical fiber device can be rolled through the oppositely charged polarizing electrodes at the Curie temperature. At 242, the optical fiber device is cooled to spontaneously polarize the core of the optical fiber device. Accordingly, the optical fiber device can generate electro-optical effects on an optical signal therein by generating an electric field through the core based on electrical signals applied to the conductors.

Figure 15:
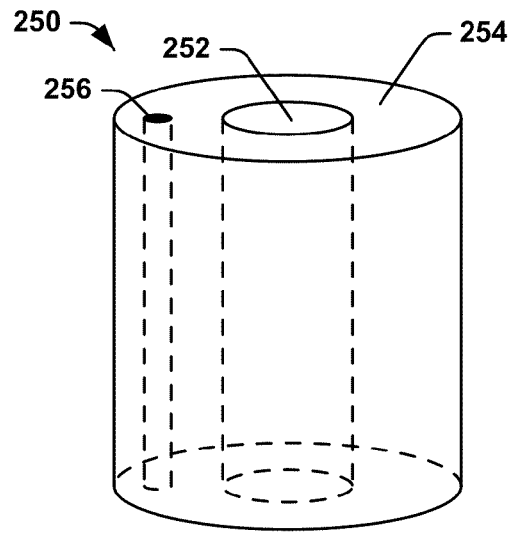

FIG. 15 demonstrates another example of a preform 250 for forming an optical fiber device in accordance with an aspect of the invention. The preform 250 includes a core material 252 and a cladding material 254. The cladding material 254 can be silica glass that can be doped to have a desired refractive index. The core material 252 can be formed of any of a variety of magneto-optical materials. As an example, the core material 252 can be diamagnetic, such as a sulfide or a selenide material, can be ferromagnetic, such as an iron-based material, or can be paramagnetic, such as including one or more rare-earth dopants.

In the example of paramagnetic materials, the core material 252 could be a crystalline material with rare-earth dopant. As such, the rare-earth dopant levels can be significantly higher than can be included in typical glass core fibers to maximize the Verdet constant, a resultant optical fiber device can have higher Raman gain, and optical losses are substantially minimized. In addition, the preform 250 also includes a conductive material 256 located in the cladding material 254. The conductive material 256 can include any of a variety of conductive materials, such as aluminum, copper, gold, platinum, or silver.

The preform 250 can be formed by first forming the cladding material 254 to the desired geometry. Holes can be drilled in the cladding material 254, such as one hole substantially at a center axis or cross-sectional centroid of the cladding material 254, and another hole is drilled into the cladding material 254 for the conductive material 256. The core material 252 can then be formed, inserted, or sleaved in the center hole that has been drilled into the cladding material 254, and the conductive material 256 can be inserted into the additional hole. The resultant preform 250 is then drawn into a resultant fiber at a temperature greater than the melting temperature of the core material 252, such as via a fiber drawing tower. In addition, as the preform 250 is being drawn, it can be rotated relative to the resultant optical fiber device, such that the conductive material 256 can be drawn helically around the core of the resultant optical fiber device.

Figure 16:
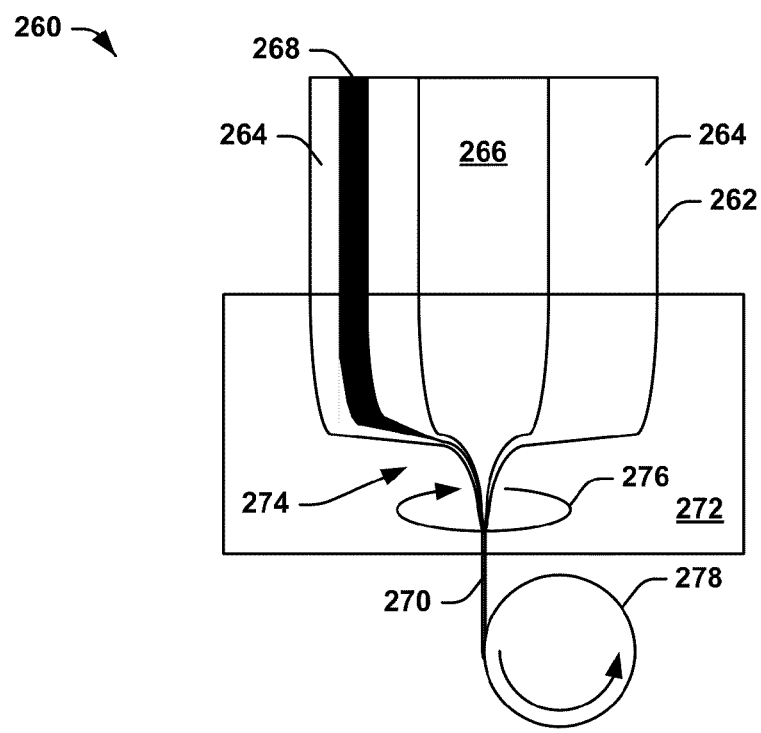
FIG. 16 demonstrates another example of a system for forming an optical fiber device in accordance with an aspect of the invention.

FIG. 16 demonstrates an example of a system 260 for forming an optical fiber device in accordance with an aspect of the invention. The system 260 demonstrates a preform 262 that includes a cladding material 264, a core material rod 266, and a conductive material 268. As such, the preform 262 is configured substantially similar to the preform 250 in the example of FIG. 15. The cladding material 264 can be formed from glass and the core material 266 can be, for example, a magneto-optic material. In the example of FIG. 16, the preform 262 is being drawn to form an optical fiber device 270.

The system 260 includes a hot zone 272, such as can be included in a fiber drawing tower furnace. As an example, the hot zone 272 can apply heat that is sufficient to soften the cladding material 264 and to melt the core material 266. Thus, the preform 262 is drawn from a first end 274 to form the optical fiber device 270 with the conductive material 268 integrated therein. In addition, as it is stretched from the first end 274, the preform 262 is rotated to helically wind the conductive material 268 around the core material 266 as the optical fiber device 270 is being drawn, as demonstrated by the rotation arrow at 276. The resultant optical fiber device 270 can thus have a crystalline core that can be single-mode or multimode, and a conductor that extends helically around the crystalline core. The optical fiber device 270 can be wound around a take-up reel 278 as it leaves the hot zone 272, such that it can cool and solidify. Therefore, the resultant optical fiber device 270 can be configured to implement magneto-optical effects, such as Faraday rotation of an optical signal therein. Accordingly, the resultant optical fiber device 270 can be used to manufacture Faraday isolators, optical polarizers, and/or transition fibers to reduce Fresnel losses.

It is to be understood that the system 260 is not intended to be limited to the example of FIG. 16. Specifically, the system 260 is demonstrated simplistically in the example of FIG. 16, such that any of a variety of fiber forming techniques can be implemented in forming the resultant optical fiber device 270.

Figure 17:
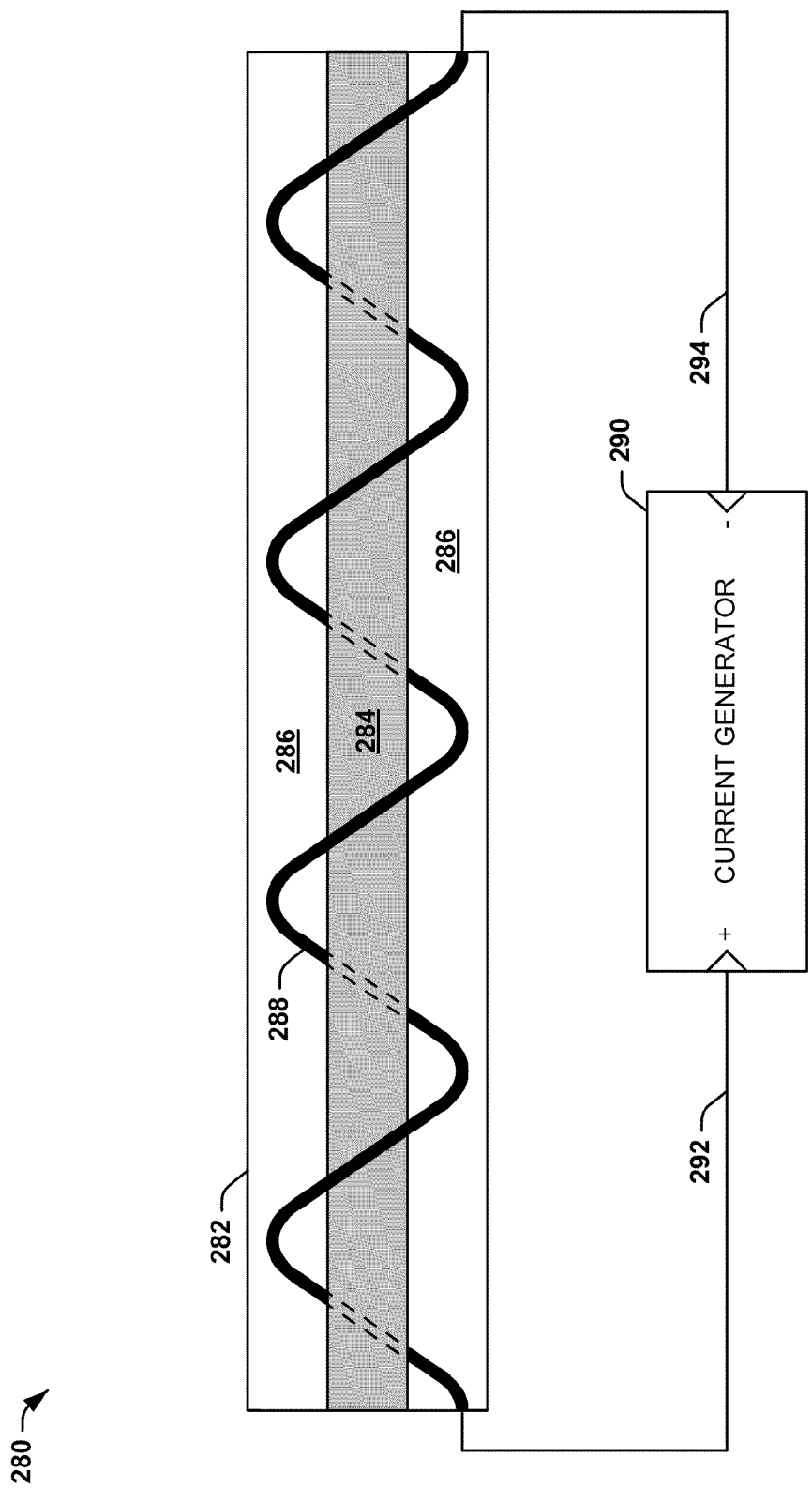
FIG. 17 demonstrates another example of an optical system in accordance with an aspect of the invention.

FIG. 17 demonstrates another example of an optical system 280 in accordance with an aspect of the invention. The optical system 280 can be implemented in any of a variety of optics applications. The optical system 280 includes an optical fiber device 282. Specifically, the example of FIG. 17 demonstrates a longitudinal cross-section of the optical fiber device 282.

The optical fiber device 282 includes a core 284, a cladding 286, and a conductor 288 that extends helically along the length of the optical fiber device 282 around the core 284. The cladding 286 can be a glass material, and the core 284 can be formed from a magneto-optic material, such as TGG. The conductor 288 can be any of a variety of conductive materials, such as aluminum, copper, gold, platinum, or silver. Therefore, the optical fiber device 282 can be substantially similar to the resultant optical fiber device 270 demonstrated in the example of FIG. 16.

The optical system 280 includes a current generator 290. The current generator 290 can be coupled to each end of the conductor 288 via respective conductive leads 292 and 294. The current generator 290 can thus be configured to apply a current through the conductor 288 via the respective leads 292 and 294. Therefore, a magnetic field can be generated through the core 284.

Therefore, by controlling magneto-optical effects of the optical input signal via the current generator 290, the induced magnetic field can thus control Faraday rotation of an optical input signal that propagates therein. As a result, the optical fiber device 282 can be implemented as a low-loss interstage Faraday isolator to mitigate deleterious back-reflection of Faraday rotated optical signals. In addition, because the Faraday isolator can be implemented in a long optical fiber, as opposed to a bulk crystal element, the optical fiber device 282 can provide large Faraday rotation of the optical signal therein with a relatively low magnitude magnetic field. Thus, power can be conserved in providing substantial amounts of Faraday rotation relative to typical Faraday isolators.

It is to be understood that the optical system 280 is not intended to be limited to the example of FIG. 17. As an example, the conductor 288 can a permanent magnet material, thus obviating the current generator 290. Thus, the magnitude of the magnetic field can be controlled, for example, by applying external magnetic fields to the optical fiber device 282. In addition, the example of FIG. 17 demonstrates a specific polarity with regard to the current provided by the current generator 290. However, it is to be understood that the current generator 290 can be configured to provide current in either direction through the conductor 288 in controlling the magnetic field therein.

Figure 18:
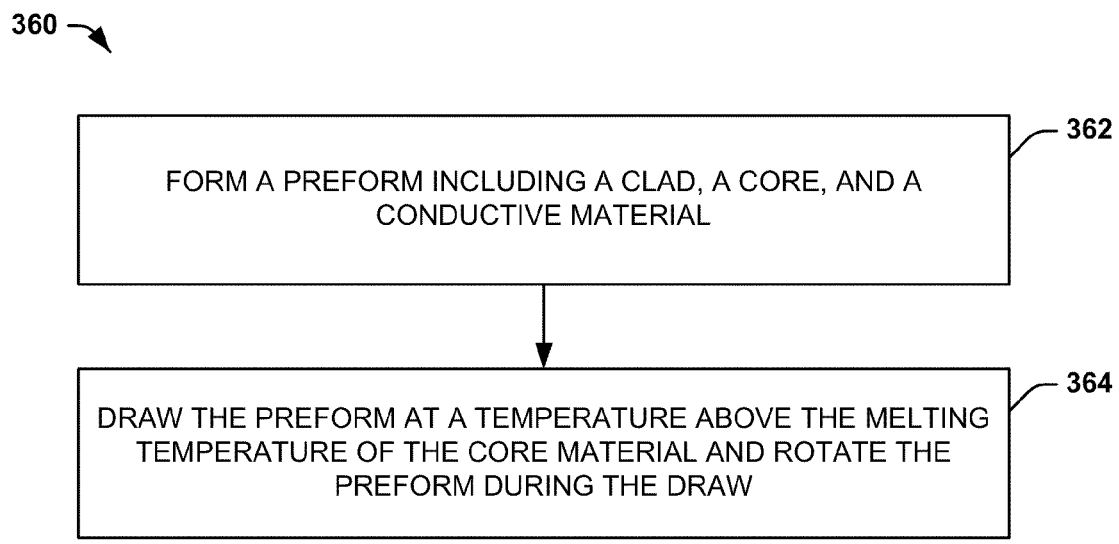
FIG. 18 demonstrates another example of a method for forming an optical fiber device in accordance with an aspect of the invention.

In view of the foregoing structural and functional features described above, a methodology in accordance with various aspects of the present invention will be better appreciated with reference to FIG. 18. While, for purposes of simplicity of explanation, the methodologies of FIG. 18 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 18 demonstrates another example of a method 360 for forming an optical fiber in accordance with an aspect of the invention. At 362, a preform is formed from a cladding material, a magneto-optic core material, and a conductive material. The cladding material can be a glass material. The core magneto-optic material can be doped with rare-earth materials. The conductive material can be formed of any of a variety of conductive materials, such as aluminum, copper, gold, platinum, or silver.

Holes can be drilled at specific locations in the cladding material for insertion of the core material rod and the conductive material. As an example, a core material rod can be inserted in an approximate axial center of the cladding material, and the conductive material can be disposed in the cladding material outside of the core material rod. At 364, the preform is drawn and rotated from a first end to form an optical fiber. The drawing of the preform can be through a hot zone that has a temperature that is sufficient to soften the cladding material and the conductive material and to melt the core material.

The present disclosure may be better demonstrated with reference to examples. As a first example, a first optical fiber having a crystalline core can be formed. Specifically, the first optical fiber can include a silicon (Si) core and a silica glass ($SiO_2$) clad. To form the first optical fiber, a single crystalline boule of silicon can be core-drilled and sleaved into a silica glass capillary tube. The melting temperature ($T_m$) of silicon is approximately 1414° C. with a coefficient of thermal expansion (CTE) of approximately 2.6 ppm/° C., and the typical drawing temperature of silica is about 2000° C., with a CTE of approximately 0.55 ppm/° C. Approximately 35 meters of about 2 mm cane (approximately 185 μm core size) can be drawn at a draw temperature of approximately 1950° C.

Figure 19:
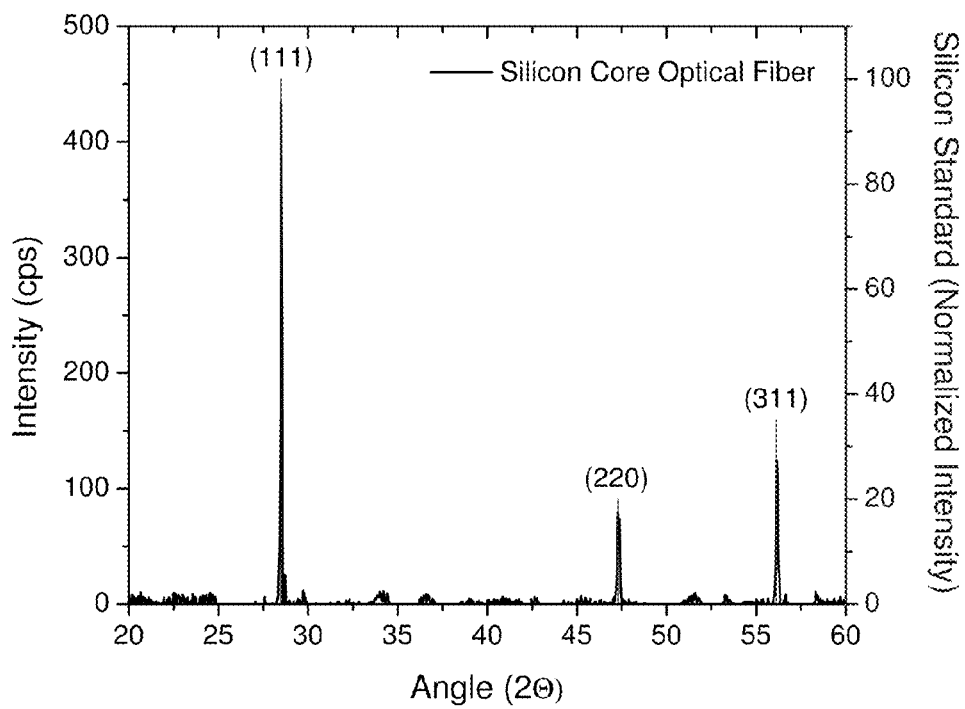
FIGS. 19 and 20 graphically illustrate cross-sectional X-ray diffraction (XRD) and Raman Analysis of an optical fiber formed as described herein including a crystalline silicon core and a silica glass clad in accordance with an aspect of the invention.

FIG. 19 graphically illustrates a cross-sectional x-ray diffraction (XRD) of the first optical fiber including a crystalline silicon core and a silica glass clad in accordance with an aspect of the invention. Specifically, the cross-sectional XRD demonstrates an angle of the core of the first optical fiber plotted against intensity (cps) and Silicon Standard. FIG. 19 thus illustrates a powder x-ray diffraction of the pulverized first optical fiber of the first example showing a clear match to a silicon standard (i.e., the core of the first optical fiber is silicon). The narrowness of the Bragg reflections implies a high degree of crystallinity of the core.

Figure 20:
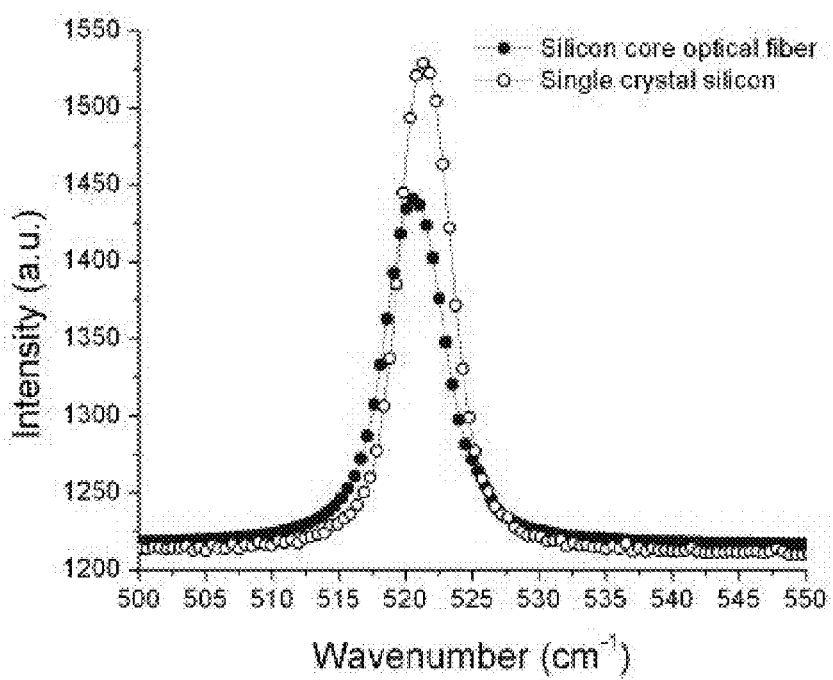

FIG. 20 graphically illustrates a Raman analysis of the first optical fiber including a crystalline silicon core and a silica glass clad in accordance with an aspect of the invention. Specifically, FIG. 20 demonstrates a wavenumber (in $cm^{-1}$) plotted against intensity of the wave (in a.u.). The Micro-Raman amplification of the core relative to a single crystal silicon standard is thus demonstrated as significantly superior based on the excellent corroboration. It is to be understood that the slightly broader and shifted spectrum can be due to stress, an amount of polycrystallinity of the core, and/or composition impurities.

Figure 21:
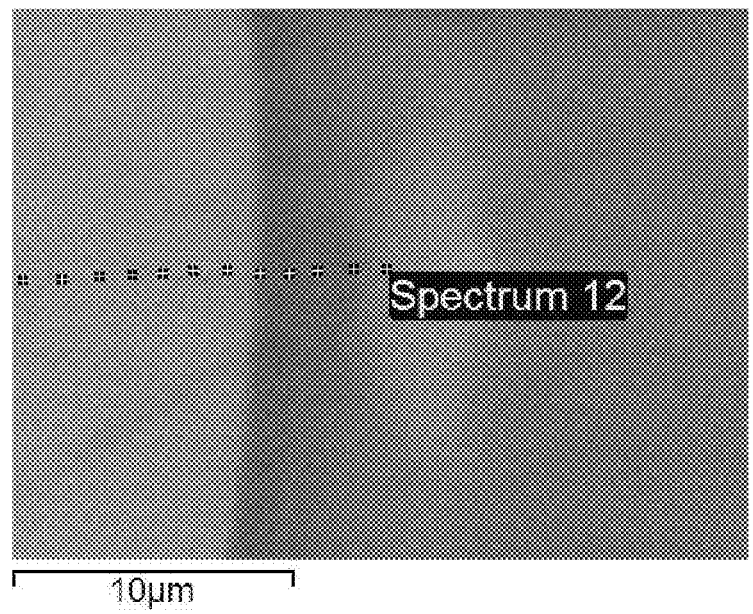
FIGS. 21 and 22 illustrate cross-sectional elemental analyses of the fiber described in FIGS. 19 and 20 in accordance with an aspect of the invention.
Figure 22:
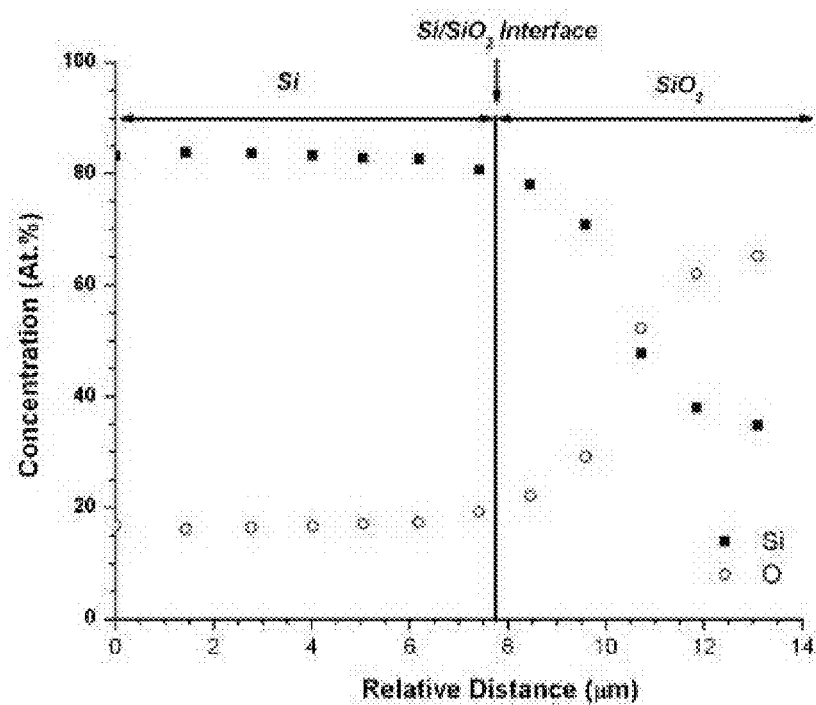

FIGS. 21 and 22 illustrate cross-sectional elemental analyses of the first optical fiber in accordance with an aspect of the invention. Specifically, FIG. 21 demonstrates a scanning electron micrograph (SEM) image of a cross-section of the first optical fiber. FIG. 22 demonstrates a plot of relative distance of the core and the clad of the first optical fiber plotted against concentration. The results of the elemental analysis is demonstrated as performed approximately every 1 μm across the core/clad interface. As can be seen, there is a stoichiometric Si:O ratio in the cladding. The $Si/SiO_2$ interface denotes the microscopically visualized interface. As can be seen, diffusional tails into the cladding, but not into the core, where there is homogenization of the core material due to the melt.

As a second example, a second optical fiber having a crystalline core can be formed. Specifically, the second optical fiber can include a germanium (Ge) core and a borosilicate glass (BS) clad. To form the second optical fiber, a single crystalline boule of Ge can be core-drilled and sleaved into a BS glass capillary tube. The $T_m$ of Ge is approximately 937° C. with a CTE of approximately 2.6 ppm/° C., and the typical drawing temperature of BS is about 1000° C., with a CTE of approximately 5.9 ppm/° C. Approximately 2 meters of about 3 mm cane (approximately 300 μm core size) can be drawn at a drawing temperature of about 1000° C.

Figure 23:
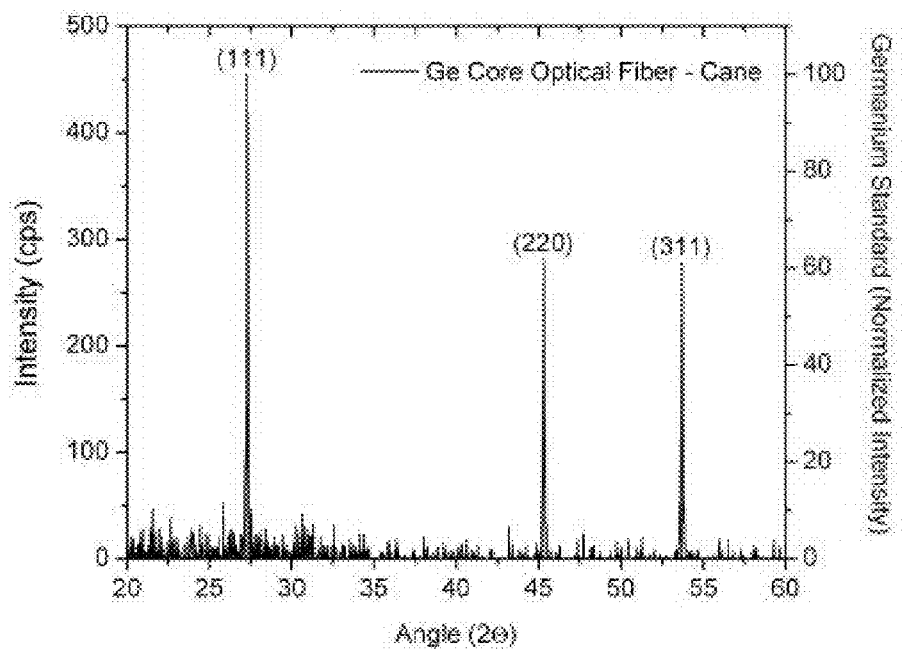
FIGS. 23 and 24 illustrate the XRD and Raman Analysis of an optical fiber formed as described herein including a crystalline germanium core and a borosilicate (BS) glass clad in accordance with an aspect of the invention.

FIG. 23 graphically illustrates a cross-sectional x-ray diffraction (XRD) of the second optical fiber including a crystalline germanium core and a silica glass clad in accordance with an aspect of the invention. Specifically, the cross-sectional XRD demonstrates an angle of the core of the first optical fiber plotted against intensity (cps) and Germanium Standard. FIG. 23 thus illustrates a powder x-ray diffraction of the pulverized second optical fiber of the first example showing a clear match to a germanium standard (i.e., the core of the second optical fiber is germanium). The R-factor for a single crystal XRD was 0.0179, which strongly implies high crystallinity of the core, without twinning.

Figure 24:
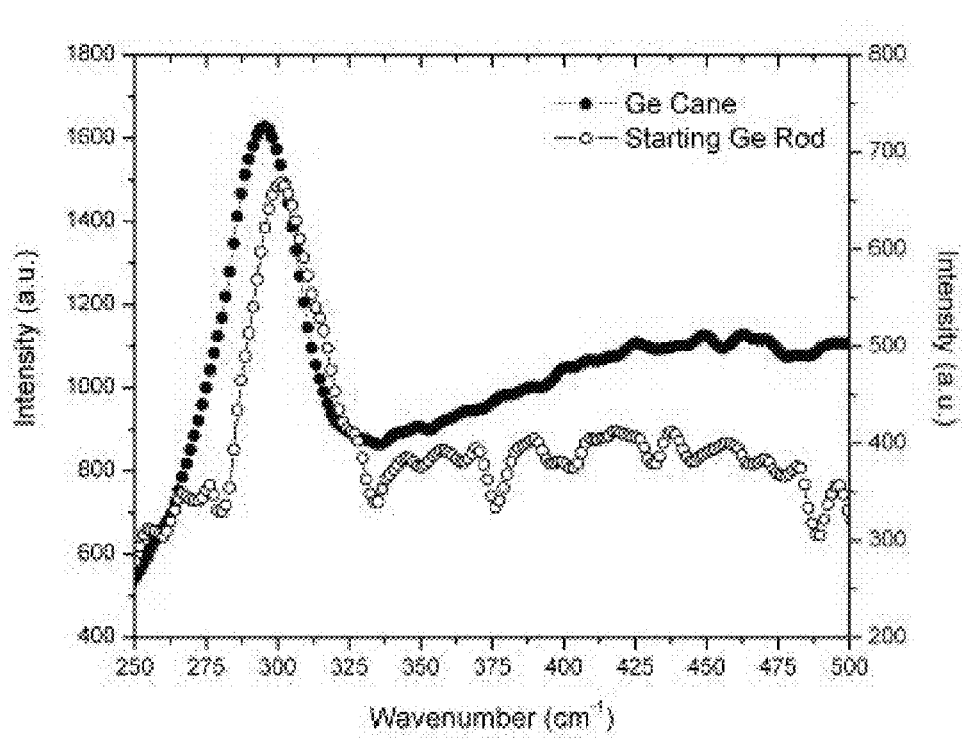

FIG. 24 graphically illustrates a Raman analysis of the second optical fiber including a crystalline germanium core and a silica glass clad in accordance with an aspect of the invention. Specifically, FIG. 24 demonstrates a wavenumber (in $cm^{-1}$) plotted against intensity of the wave (in a.u.). The Micro-Raman amplification of the core relative to a single crystal germanium standard is thus likewise demonstrated as significantly superior based on the excellent corroboration. It is to be understood that the slightly broader and shifted spectrum can be due to stress, an amount of polycrystallinity of the core, and/or composition impurities.

Figure 25:
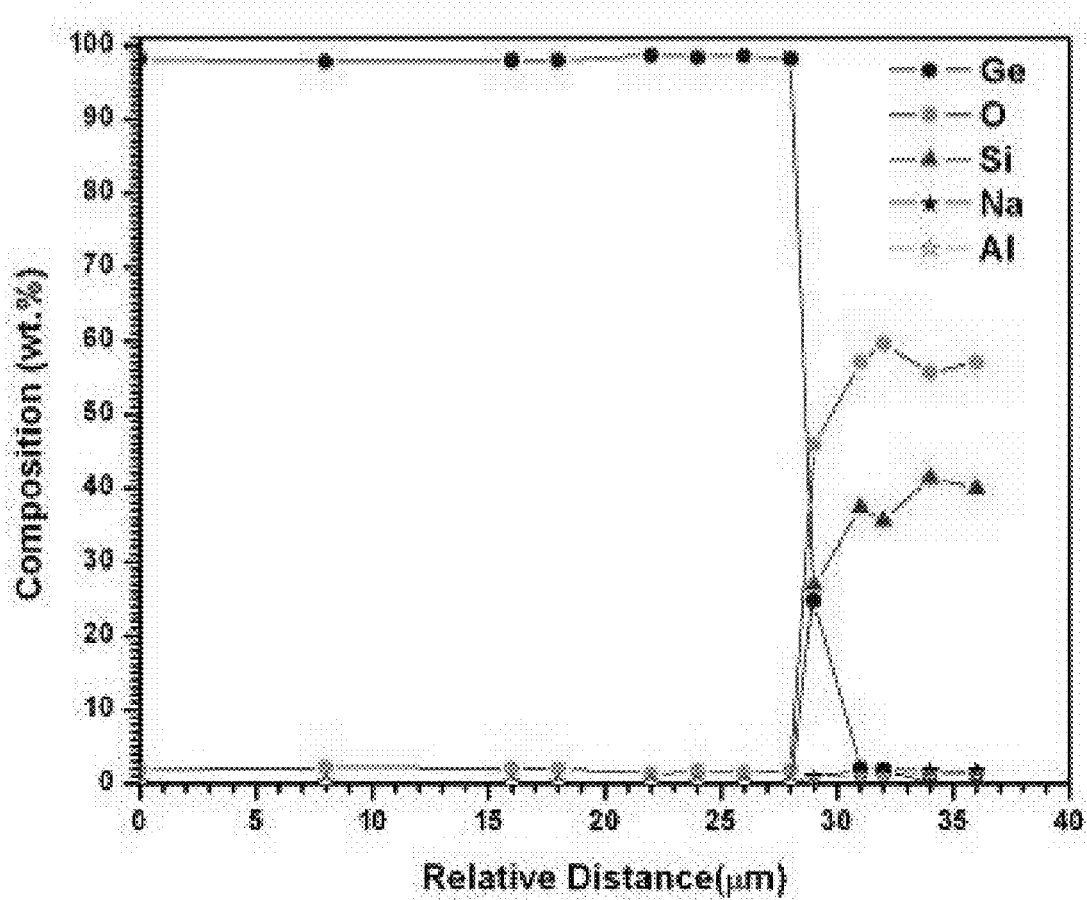
FIG. 25 illustrates a cross sectional elemental analysis of the fiber described in FIGS. 23 and 24 in accordance with an aspect of the invention.

FIG. 25 illustrates a cross-sectional elemental analysis of the second optical fiber in accordance with an aspect of the invention. Specifically, FIG. 25 demonstrates a plot of relative distance of the core and the clad of the first optical fiber plotted against concentration. The results of the elemental analysis is demonstrated as performed approximately every 1 μm across the core/clad interface. As can be seen, the elemental analysis corroborates the high purity Ge core (experimental sensitivity was about 1 wt. %).

Figure 26:
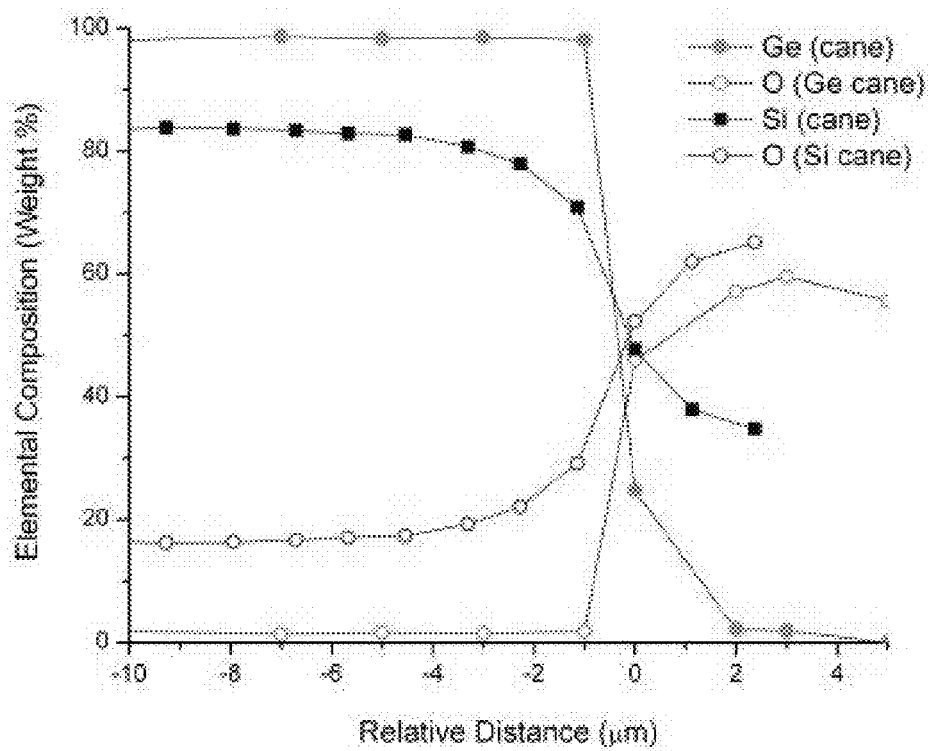
FIGS. 26 and 27 compare the elemental analyses of the fiber of FIGS. 19 and 20 and the fiber of FIGS. 23 and 24 with regard to cross-sectional analyses in accordance with an aspect of the invention.
Figure 27:
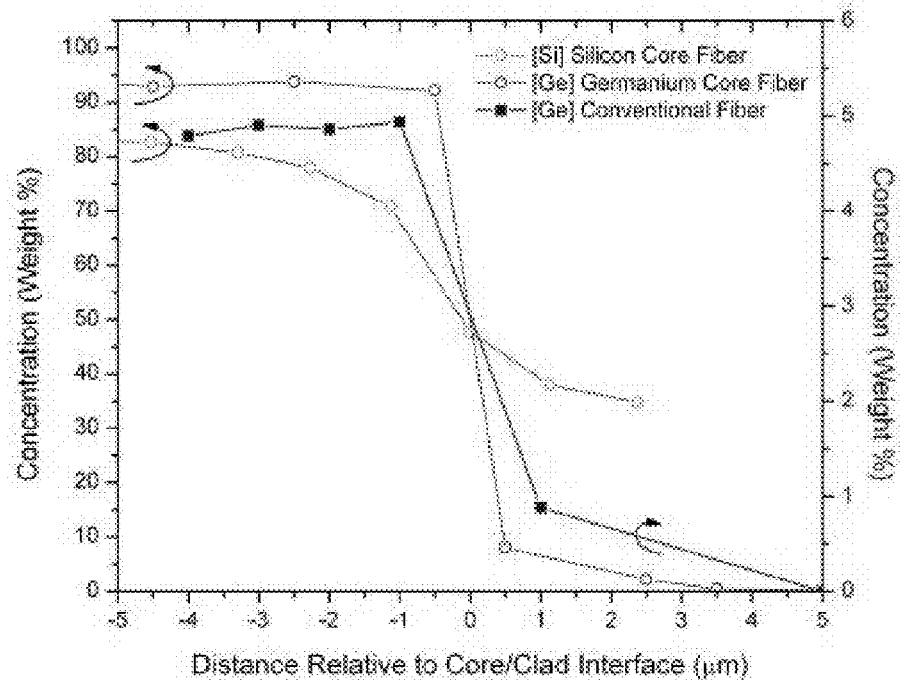

FIG. 26 illustrates a cross-sectional elemental analysis of the first and second optical fibers in accordance with an aspect of the invention. Specifically, FIG. 25 demonstrates a plot of relative distance of the core and the clad of the first and second optical fibers plotted against elemental composition. FIG. 27 illustrates another cross-sectional elemental analysis of the first and second optical fibers in accordance with an aspect of the invention. Specifically, FIG. 27 demonstrates a plot of relative distance of the core/clad interface of the first and second optical fibers plotted against concentration. The results of the elemental analysis is demonstrated as performed approximately every 1 μm across the core/clad interface. As demonstrated in the examples of FIGS. 26 and 27, there is more gradation in the clad, and the germanium core fiber has a more step-like index profile that conventional telecommunications fibers.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming an optical fiber, the method comprising:
   providing a preform having a semiconductor core material and a glass cladding material surrounding the semiconductor core material;
   drawing the preform at a temperature that is greater than a melting temperature of the semiconductor core material to form a drawn fiber; and
   cooling the drawn fiber from a molten state to spontaneously crystallize the semiconductor core material to form the optical fiber having a crystalline semiconductor fiber core and a cladding that surrounds the crystalline fiber semiconductor core and extends axially along a length of the crystalline semiconductor fiber core.

2. The method of claim 1, further comprising:
   generating one of a boule and window of the semiconductor core material;
   core-drilling the one of the boule and window to generate a semiconductor core material rod; and
   sleeving the semiconductor core material rod within the glass cladding material.

3. The method of claim 1, wherein providing the preform comprises locating the semiconductor core material within the glass cladding material by one of locating a powder of plurality of chips formed of the semiconductor core material within a void defined by the glass cladding material and vapor depositing the semiconductor core material within the void defined by the glass cladding material.

4. The method of claim 1, wherein the semiconductor core material is a Type IV semiconductor material.

5. The method of claim 1, wherein the semiconductor core material is a Type III-V semiconductor material.

6. The method of claim 1, wherein the semiconductor core material is a Type II-VI semiconductor material.

7. The method of claim 1, further comprising doping the semiconductor core material with one of an n-dopant and a p-dopant.

8. The method of claim 1, wherein providing the preform comprises providing the semiconductor core material with a defined cross-sectional shape, wherein the core of the formed optical fiber has a cross-sectional shape substantially identical to the shape of the semiconductor core material of the preform.

9. The method of claim 8, wherein the defined cross-sectional shape is substantially rectangular.

10. The method of claim 8, wherein the defined cross-sectional shape is substantially circular.

11. The method of claim 1, wherein providing the preform comprises providing a plurality of concentric cladding materials to result in the optical fiber having a respective plurality of claddings, a given one of the respective plurality of claddings being an optical pump cladding.

12. The method of claim 1, wherein the optical fiber has a polycrystalline semiconductor core, the method further comprising instituting relative motion between the optical fiber beginning with the first end and a heat source that provides heat at an approximate crystallization temperature to convert the polycrystalline semiconductor core to a single crystal semiconductor core.

13. The method of claim 1, wherein providing the preform comprises inserting at least one conductive material into the cladding material, the at least one conductive material extending axially through the cladding material substantially parallel with the semiconductor core material.

14. The method of claim 13, wherein inserting the at least one conductive material comprises inserting a pair of conductive material rods such that the conductive material rods are symmetrically disposed in the cladding material about an axial center of the preform.

15. The method of claim 14, wherein drawing the preform comprises drawing the preform to form the drawn fiber having a pair of conductors that extend axially along the length of the optical fiber, the pair of conductors being configured to generate electric fields through the crystalline semiconductor fiber core in response to electrical signals.

16. The method of claim 15, further comprising:
generating the electrical signals via an electro-optical modulator; and
modulating an optical input signal that is launched into the crystalline semiconductor core in response to the electric fields.

17. The method of claim 13, wherein inserting the at least one conductive material comprises inserting a single conductive material in the cladding material parallel with the semiconductor core material.

18. The method of claim 17, wherein drawing the preform comprises rotating the preform as the preform is drawn, wherein the optical fiber thus has a single conductor that extends helically around the crystalline semiconductor fiber core along a length of the optical fiber, the single conductor being configured to generate magnetic fields along the length of the optical fiber through the crystalline semiconductor fiber core of the optical fiber in response to currents provided through the single conductor.

19. The method of claim 18, further comprising implementing the optical fiber as a Faraday isolator based on the magnetic fields that are generated along the length of the optical fiber.

20. The method of claim 1, wherein providing the preform comprises providing the preform having a silicon core material and a silica glass cladding material surrounding the silicon core material, and wherein drawing the preform comprises drawing the preform at a temperature that is greater than approximately 1414° C. and less than approximately 2000° C.

21. The method of claim 1, wherein providing the preform comprises providing the preform having a germanium core material and a borosilicate glass cladding material surrounding the germanium core material, and wherein drawing the preform comprises drawing the preform at a temperature that is between approximately 937° C. and approximately 1000° C.

22. The method of claim 1, wherein providing the preform comprises providing the preform having a crystalline core material that exhibits magneto-optic material properties.

23. The method of claim 1, wherein providing the preform comprises providing the preform having a crystalline core material that exhibits linear electro-optic material properties.

24. A method of forming an optical fiber, the method comprising:
providing a preform having a silicon core material and a silica glass cladding material surrounding the silicon core material;
drawing the preform at a temperature that is greater than a melting temperature of the silicon core material to form a drawn fiber, the temperature being greater than approximately 1414° C. and less than approximately 2000° C.; and
cooling the drawn fiber from a molten state to spontaneously crystallize the silicon core material to form the optical fiber having a crystalline silicon fiber core and a silica glass cladding that surrounds the crystalline silicon fiber core and extends axially along a length of the crystalline silicon fiber core.

25. A method of forming an optical fiber, the method comprising:
providing a preform having a germanium core material and a borosilicate glass cladding material surrounding the germanium core material;
drawing the preform at a temperature that is greater than a melting temperature of the germanium core material to form a drawn fiber, the temperature being greater than approximately 937° C. and less than approximately 1000° C.; and
cooling the drawn fiber from a molten state to spontaneously crystallize the germanium core material to form the optical fiber having a crystalline germanium fiber core and a borosilicate glass cladding that surrounds the crystalline germanium fiber core and extends axially along a length of the crystalline germanium fiber core.

* * * * *

UNITED STATES PATENT AND TRADEMARK OFFICE
CERTIFICATE OF CORRECTION

| | | |
|---|---|---|
| PATENT NO. | : 8,934,748 B2 | Page 1 of 1 |
| APPLICATION NO. | : 12/989326 | |
| DATED | : January 13, 2015 | |
| INVENTOR(S) | : Rice et al. | |

It is certified that error appears in the above-identified patent and that said Letters Patent is hereby corrected as shown below:

Title Page, item (75),

Please correct the third inventors name as follows:

"HACOP" should be -- HAGOP --

Signed and Sealed this
Fifth Day of May, 2015

Michelle K. Lee
*Director of the United States Patent and Trademark Office*